United States Patent
Nagasu et al.

(10) Patent No.: US 6,414,370 B1
(45) Date of Patent: Jul. 2, 2002

(54) SEMICONDUCTOR CIRCUIT PREVENTING ELECTROMAGNETIC NOISE

(75) Inventors: Masahiro Nagasu, Hitachinaka; Hideo Kobayashi, Hitachi; Hideki Miyazaki, Hitachi; Shin Kimura, Hitachi; Junichi Sakano, Hitachi; Mutsuhiro Mori, Mito, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/639,801

(22) Filed: Aug. 17, 2000

Related U.S. Application Data

(62) Division of application No. 08/651,875, filed on May 21, 1996.

(30) Foreign Application Priority Data

May 22, 1995 (JP) .............................................. 7-122117
Sep. 20, 1995 (JP) .............................................. 7-241233

(51) Int. Cl.$^7$ ..................... H01L 27/082; H01L 27/102; H01L 29/70; H01L 31/11
(52) U.S. Cl. ........................ 257/575; 257/574; 257/576; 257/360; 257/361; 257/378
(58) Field of Search ................................. 257/574–576, 257/560, 561, 378

(56) References Cited

U.S. PATENT DOCUMENTS

| | | | |
|---|---|---|---|
| 4,233,529 A | 11/1980 | Whitlock | 327/575 |
| 4,656,414 A | 4/1987 | Morud | 323/289 |
| 4,798,983 A | 1/1989 | Mori | 327/433 |
| 4,928,053 A | 5/1990 | Sicard et al. | 323/284 |
| 5,122,946 A | 6/1992 | Taylor | 363/21 |
| 5,416,361 A | 5/1995 | John et al. | 327/310 |
| 5,504,368 A | * 4/1996 | Sawada | 257/556 |
| 5,525,826 A | * 6/1996 | Palara | 257/378 |
| 5,576,648 A | 11/1996 | Rossie et al. | 327/110 |
| 5,644,148 A | * 7/1997 | Kinzer | 257/133 |
| 5,929,485 A | * 7/1999 | Takahashi | 257/343 |

FOREIGN PATENT DOCUMENTS

| | | |
|---|---|---|
| JP | 49-74862 | 7/1974 |
| JP | 55-148469 | 11/1980 |
| JP | 2-025107 | 1/1990 |
| JP | 3-208410 | 9/1991 |
| JP | 4-115715 | 4/1992 |
| JP | 4-312981 | 11/1992 |
| JP | 5-90933 | 4/1993 |
| JP | 6-204410 | 7/1994 |
| JP | 8-316501 | 11/1996 |
| JP | 9-047013 | 2/1997 |

OTHER PUBLICATIONS

EPE Journal, vol. 4, No. 2, Jun. 1994—Products and Applications—IGBT Technology for Distributorless Ignition Systems, pp. 8–9.

* cited by examiner

Primary Examiner—Eddie Lee
Assistant Examiner—Jesse A. Fenty
(74) Attorney, Agent, or Firm—Antonelli, Terry, Stout & Kraus, LLP

(57) ABSTRACT

A semiconductor circuit or a semiconductor device has the current-voltage characteristic that, in a blocking-state of the semiconductor circuit or the semiconductor device, a current gently flows for values of a voltage equal to or greater than a first voltage value but equal to or smaller than a second voltage value, whereas a current abruptly flows for values of a voltage greater than the second voltage value. Due to the current-voltage characteristic, energy accumulated in an inductance provided within the circuit is consumed by a differential resistance of the semiconductor circuit or a semiconductor, thereby preventing the occurrence of the electromagnetic noise and an excessively large voltage.

12 Claims, 18 Drawing Sheets

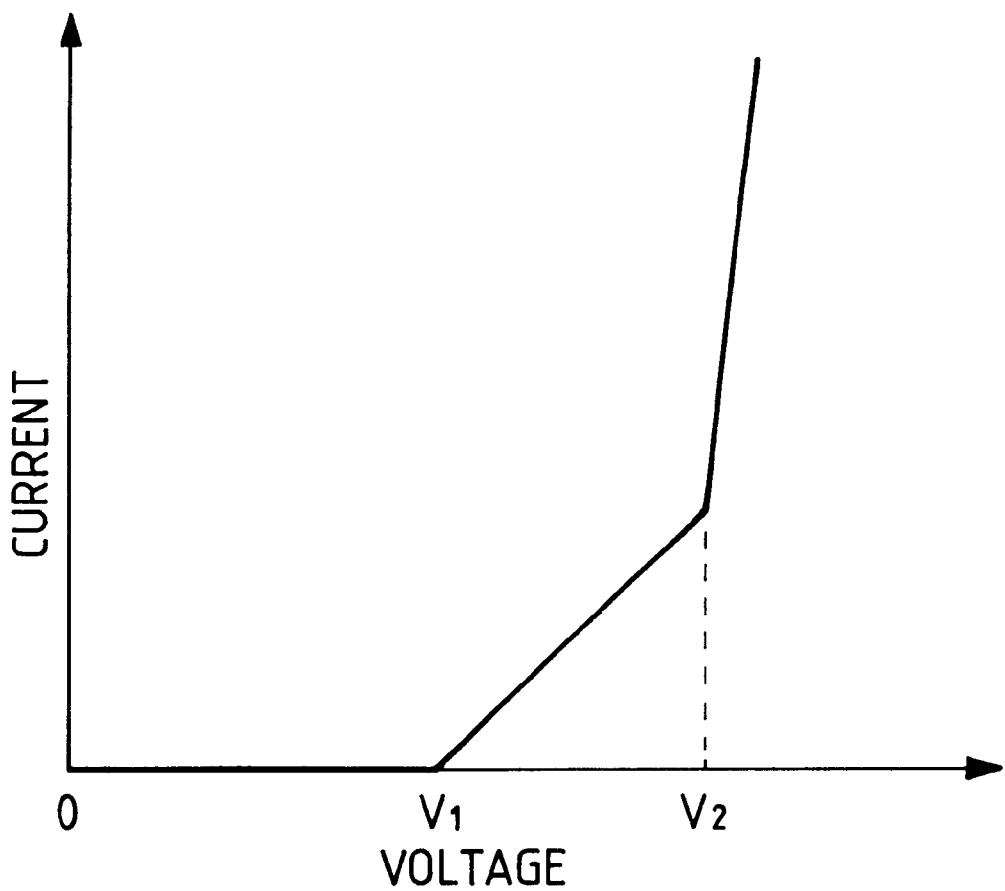

EQUIVALENT
CIRCUIT
OF LOOP (1)

EQUIVALENT
CIRCUIT
OF LOOP (2)

EQUIVALENT
CIRCUIT
OF LOOP (3)

SEMICONDUCTOR CIRCUIT PREVENTING ELECTROMAGNETIC NOISE

CROSS-REFERENCE TO RELATED APPLICATION

This application is a divisional of application Ser. No. 08/651,875, filed May 21, 1996, the entire disclosure of which is incorporated herein by reference.

BACKGROUND OF THE INVENTION

The present invention relates to a semiconductor circuit of the type which may be used in equipment such as a power converting apparatus, a driving method of the semiconductor circuit and a semiconductor device.

A power converting apparatus comprises not only switching devices, such as MOSFETs and IGBTs (Insulated gate Bipolar Transistor), devices having a rectifying effect, such as diodes, and passive devices, such as capacitors, inductrances and resistors, but also wires which have a parasitic inductance. The power converting apparatus converts power by repeating the on and off states of the switching and rectifying devices, in which in on and off states, currents are flowing through and are cut off from the devices, respectively. As a result, a voltage rising abruptly to a value much higher than the power-supply voltage is applied to the switching and rectifying devices at the time the devices undergo transition from the on state to the off state due to the effect of parasitic inductance.

In order to prevent the devices from being damaged by an high voltage (a spike voltage) generated at the switching time, traditionally, devices having a breakdown voltage greater than a value obtained by estimating the magnitude of such a spike voltage are used, or, as an alternative, the spike voltage is eliminated by means of a snubber circuit. The use of devices having a high breakdown voltage entails not only a high cost but, also, an increased amount of incurred power loss, giving rise to an undesirable problem. On the other hand, the use of a snubber circuit for avoiding a spike voltage increases the number of components. As a result, the cost and the size of the power converting apparatus increase.

By the way, a spike voltage is generated at the switching time because a current that has been flowing through the switching device and the inductance abruptly decreases due to the switching operation of the switching device. Thus, if the abrupt decrease in current can be suppressed, the spike voltage can also be suppressed as well. In a typical method for suppressing an abrupt decrease in current, a Zener diode or an avalanche diode is employed in parallel to the switching device. When a voltage applied to an avalanche diode exceeds the breakdown voltage thereof, a current is allowed to flow through the avalanche diode, avoiding an abrupt decrease in current.

However, the use of such a diode gives rise to the following problem. When a current flows through an avalanche diode, the decrease in current flowing through a parasitic inductance disappears due to the fact that the resistance of the avalanche diode is all but zero once the avalanche diode has entered a breakdown state. The disappearance of the decrease in current, in turn, causes the voltage applied to the avalanche diode to decrease. As the voltage applied to the avalanche diode becomes lower than a voltage that causes the avalanche diode to enter an avalanche breakdown state, the avalanche diode enters an off state, trying to abruptly reduce a current flowing through the inductance. The attempt to abruptly reduce the current flowing through the inductance causes the avalanche diode to again enter an avalanche breakdown state in which a current can flow through it. That is to say, the voltage applied to the avalanche diode and the current flowing through it keep oscillating and the oscillation of the voltage and current is a cause of the generation of electromagnetic noise.

Another method besides the technique of using an avalanche diode is described, for example, in a document called EPE Journal, Vol. 4, No. 2, June (1994), pages 8 to 9. The method described therein is an example of techniques called dynamic clamping. According to the dynamic clamping technique, an avalanche diode is interposed between the collector and gate electrode of an IGBT, whereas a resistor is interposed between the gate and emitter electrode thereof. As the collector voltage exceeds the breakdown voltage of the avalanche diode, a current flows through the avalanche diode and the resistor, increasing the gate voltage. The increase in gate voltage causes a collector current to flow through the IGBT, preventing a large voltage from being applied to the device. In this case, none the less, a problem similar to that encountered in the technique of using an avalanche diode as described above also arises.

With the collector voltage exceeding the breakdown voltage of the avalanche diode, a voltage equal to the difference between the collector voltage and the avalanche-breakdown voltage is applied to the gate. That is to say, as the collector voltage exceeds the avalanche-breakdown voltage, the portion of the collector voltage above the avalanche-breakdown voltage is all applied to the gate.

In general, the IGBT has a collector current which is greatly changing due to a small variation in gate voltage so that, when the collector voltage exceeds the avalanche-breakdown voltage, the IGBT current increases abruptly. In the case of an IGBT having a breakdown voltage of several hundreds of volts and a rated current density of 200 A/cm2, for example, the saturated current density at a gate voltage of 15V reaches as much as several thousands of amperes per square cm. This implies that, when the collector voltage exceeds the breakdown voltage of an avalanche diode interposed between the collector and the gate by a potential of only 15V, the collector current can actually reach a value of several thousands of amperes. That is to say, an IGBT adopting the dynamic clamping technique exhibits a characteristic very similar to that of an avalanche diode wherein, at a certain voltage, the current abruptly increases. For this reason, this dynamic clamping technique also has the same problem as that encountered in the example of using an avalanche diode.

As described above, the techniques adopted in the conventional power converting apparatus for suppressing a spike voltage have problems of an increased amount of incurred power loss, a rising cost and generation of electromagnetic noise. It is thus an object of the present invention to provide a semiconductor circuit which is capable of solving these problems, a technique of driving the semiconductor circuit and a semiconductor device.

SUMMARY OF THE INVENTION

The semiconductor circuit provided by the present invention comprises a circuit incorporating at least a semiconductor device and an inductance connected to the circuit. The semiconductor circuit is used for controlling a current flowing through the circuit so that the current is turned on and off. A voltage is applied in a current blocking direction between the terminals of the circuit that includes the semiconductor device. When the blocking-direction voltage is greater than or equal to a first voltage value, but is smaller than or equal to a second voltage value, the current increases as the blocking-direction voltage increases. As the blocking-direction voltage further increases, exceeding the second voltage value, the current increases with an increase in blocking-direction voltage at a rate of increase higher than a rate of increase that prevails for values of the blocking-direction voltage greater than or equal to the first voltage value, but smaller than or equal to the second voltage value. For values of the blocking-direction voltage smaller than the first voltage value, only a leakage current flows, in substance, putting the circuit in a current cut-off state.

It should be noted that, in referring to a circuit including a semiconductor device, a wide range of circuits other than a circuit including semiconductor devices and other passive elements are implied. For example, a circuit including a semiconductor device can refer to a circuit comprising only semiconductor devices or a semiconductor module having semiconductor devices embedded in a case or having semiconductor devices embedded along with peripheral circuits in a case. In addition, in referring to a semiconductor device, a semiconductor switching device, the main control current of which can be controlled by a control signal, or a diode is meant. Furthermore, an inductance implies not only an inductance of a load, such as a motor, but also an inductance of a circuit wire. The meanings of the terms circuit, semiconductor device and inductance as explained above hold true for all configurations described below.

In addition, a circuit including a semiconductor device as described herein does not have to be a semiconductor circuit wherein an inductance is connected thereto and in which the flow of the main current can be controlled to on and off states. Instead, a circuit including a semiconductor device can be one of a variety of circuits, to which semiconductor devices are connected.

The present invention also provides a technique for controlling the semiconductor circuit whereby a control signal is supplied to a semiconductor switching device employed in the semiconductor circuit in accordance with a voltage applied to the main terminals of the semiconductor device in a current blocking direction so that, when the blocking-direction voltage is greater than or equal to a first voltage value, but is smaller than or equal to a second voltage value, a main current increases as the blocking-direction voltage rises, and, as the blocking-direction voltage further rises, exceeding the second voltage value, the main current increases with an increase in blocking-direction voltage at a rate of increase higher than a rate of increase that prevails for values of the blocking-direction voltage greater than or equal to the first voltage value, but smaller than or equal to the second voltage value. For values of the blocking-direction voltage smaller than the first voltage value, only a leakage current flows, in substance, putting the circuit in a current cut-off state.

In addition, the present invention also provides a semiconductor device wherein, when a voltage applied to main terminals of the semiconductor device in a current blocking direction is greater than or equal to a first voltage value, but is smaller than or equal to a second voltage value, a main current increases as the blocking-direction voltage rises, and, as the blocking-direction voltage further rises, exceeding the second voltage value, the main current increases with an increase in blocking-direction voltage at a rate of increase higher than a rate of increase that prevails for values of the blocking-direction voltage greater than or equal to the first voltage value, but smaller than or equal to the second voltage value. For values of the blocking-direction voltage smaller than the first voltage value, only a leakage current flows, in substance, putting the circuit in a current cut-off state. The actual structure of the semiconductor device having such a characteristic will become more apparent from a detailed description of preferred embodiments given later.

When the voltage applied to the circuit including the semiconductor device, the semiconductor circuit or the semiconductor device described above in a current blocking direction exceeds the first voltage value, a current flows in accordance with the magnitude of the blocking-direction voltage. This current prevents a current flowing through an inductance existing inside the circuit, or an inductance connected to the semiconductor device, from abruptly decreasing, gradually limiting the increase in voltage applied to the circuit or the semiconductor device. As the blocking-direction voltage is further increased, exceeding the second voltage value, an even larger current flows, abruptly limiting the increase in voltage applied to the circuit or the semiconductor device.

That is to say, a differential resistance for the range of the blocking-direction voltage between the first and second voltage values is greater than a differential resistance for the range of the blocking-direction voltage above the second voltage value. It should be noted that, by a differential resistance, a ratio of an infinitesimal change in voltage to an infinitesimal change in current is meant. For this reason, when a voltage is induced in the inductance in a switching operation of the semiconductor device or the like, the differential resistance for the range of the blocking-direction voltage between the first and second voltage values plays a role of absorbing energy accumulated in the inductance, and the differential resistance for the range of the blocking-direction voltage above the second voltage value plays a role of limiting a further increase in inductance voltage. As a result, electromagnetic noise caused by current and voltage oscillation and an excessive voltage leading to the destruction of the semiconductor device can be prevented from being generated.

BRIEF DESCRIPTION OF THE DRAWINGS

FIG. 1 is a diagram showing a current-voltage characteristic in a blocking state of a semiconductor circuit or a semiconductor device to which the present invention is applied;

FIGS. 6(a), 6(c), 6(d) and 6(e) are circuit diagrams of embodiments comprising avalanche diodes and a resistor. whereas

FIG. 7(a) is a diagram of an insulated gate bipolar transistor to which the invention is applied, whereas

DETAILED DESCRIPTION OF THE PREFERRED EMBODIMENTS

FIGS. 1 to 4 are used for explaining embodiments provided by the present invention. FIG. 1 shows a current-voltage characteristic in a current blocking state of a semiconductor device or a semiconductor circuit provided by the present invention. FIG. 2(a) shows an embodiment of a circuit provided by the present invention. FIG. 2(b) shows waveforms of currents and voltages appearing at a variety of locations in the circuit shown in FIG. 2(a). FIG. 3(a) shows another embodiment of a circuit provided by the present invention. FIG. 3(b) shows waveforms of currents and voltages appearing at a variety of locations in the circuit shown in FIG. 3(a). FIGS. 4(a) to 4(c) are circuit diagrams used for explaining effects provided by the present invention.

Figure 2A:
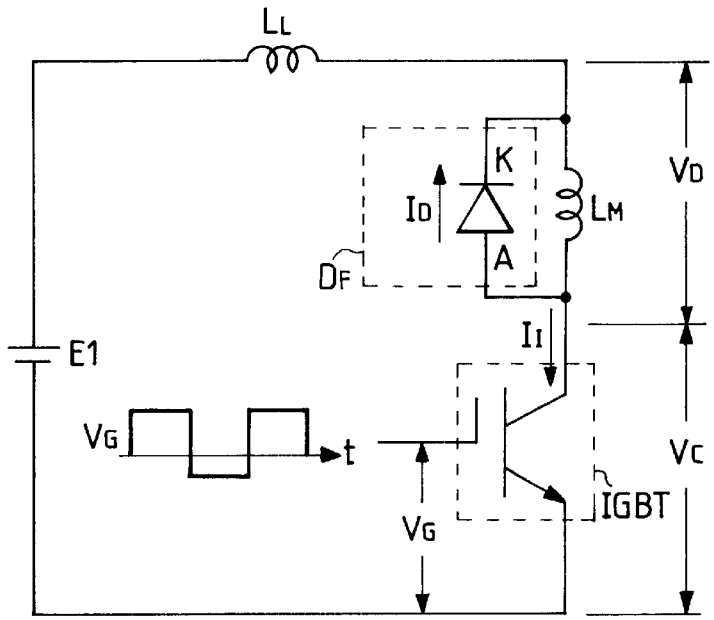
FIG. 2(a) is a circuit diagram showing an embodiment implementing a circuit provided by the present invention.
Figure 2B:
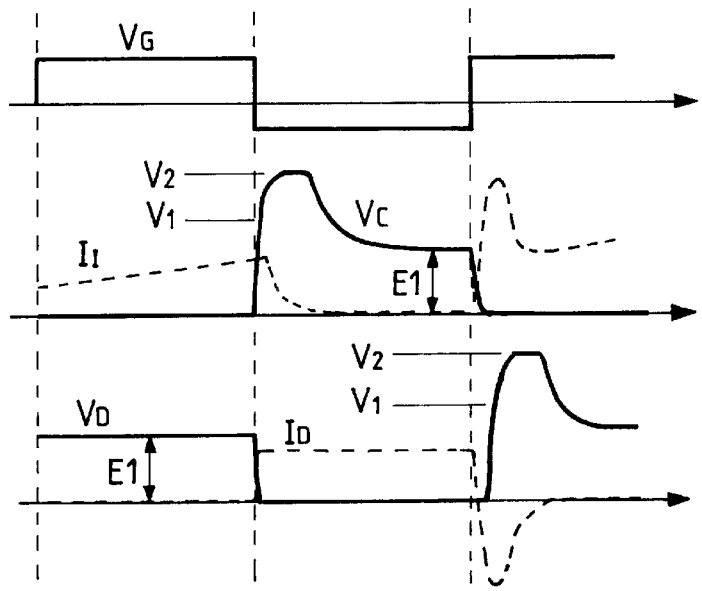
FIG. 2(b) shows waveforms appearing at a variety of locations in the circuit.

Notation $V_1$ shown in FIG. 1 is a voltage at which a current starts to flow in a current blocking state. Notation $V_2$ is a voltage at which the current starts to increase abruptly. Notation $D_F$ shown in FIG. 2(a) is a diode exhibiting a current-voltage characteristic provided by the present invention, whereas notation IGBT denotes a typical switching device having a current-voltage characteristic provided by the present invention. Notation E1 is a direct-current power supply. Notations $L_L$ and $L_M$ denote a parasitic inductance of a wire and the like and the inductance of a load, respectively. Notations denoting currents and voltages used in FIG. 2(b) are the same as those shown in FIG. 2(a).

First of all, the fact that the current-voltage characteristic shown in FIG. 1 suppresses vibration of the current and voltage as well as avoids an excessively large voltage will be explained by referring to FIG. 2(a).

When the IGBT which functions as a switching device is put in an off state by the gate signal $V_G$, the current flowing through the IGBT decreases abruptly. However, the current which has been flowing through the switching device IGBT is also flowing through a wire and the like having the parasitic inductance $L_L$ and a load having the inductance $L_M$ and, thus, can not decrease abruptly. Since the flywheel diode $D_F$ is connected in parallel to the load having the inductance $L_M$, the current that has been flowing through the load having the inductance $L_M$, continues to flow now through the flywheel diode $D_F$ as a current $I_D$. Since, at that time, the current $I_D$ flows through the flywheel diode $D_F$ as a forward-direction current, the voltage between the main electrodes of the load having the inductance $L_M$ has a low value in the order of a few volts.

On the other hand, since the current that has been flowing through the wire and the like having the parasitic inductance $L_L$ is abruptly cut off by the switching device IGBT, the collector voltage of the switching device IGBT increases. Because the switching device IGBT has a current-voltage characteristic in a current blocking state like the one shown in FIG. 1, however, a current starts to flow gradually through the switching device IGBT as the collector voltage $V_C$ exceeds the voltage value $V_1$. As a result, the collector voltage VC increases while gradually reducing its rate of increase. As is obvious from the current-voltage characteristic shown in FIG. 1, the switching device IGBT exhibits are rather large differential resistance for collector-voltage values greater than or equal to the voltage value $V_1$ which differential resistance expends energy accumulated in the parasitic inductance $L_L$.

When the differential resistance cannot afford to use up all of the energy accumulated in the parasitic inductance $L_L$, the collector voltage $V_C$ increases further. As the collector $V_C$ exceeds the voltage value $V_2$, the current flowing through the switching device IGBT abruptly increases at a rate greater than the rate prevailing so far, preventing the collector voltage $V_C$ from further increasing due to the effect of the parasitic inductance $L_L$. After sustaining this state for a while, the collector voltage $V_C$ starts to decrease. As the collector voltage $V_C$ falls to a value smaller than the voltage value $V_2$, the energy accumulated in the parasitic inductance $L_L$ is consumed by the differential resistance for values of the collector voltage $V_C$ between the voltages $V_1$ and $V_2$, causing the collector voltage $V_C$ to decrease gradually.

As described above, in the case of a switching device having a current-voltage characteristic like the one shown in FIG. 1, energy accumulated in the parasitic inductance $L_L$ is consumed by the differential resistance for values of the collector voltage $V_C$ between the voltage values $V_1$ and $V_2$.

As a result, unlike the conventional switching device, electromagnetic noise is by no means generated by oscillation of the current and voltage. On the top of that, since the collector voltage $V_C$ is suppressed to a value in close proximity to the voltage value $V_2$, the switching device IGBT itself and circuit components connected in parallel thereto can thus be prevented from being damaged by an excessively large voltage.

When a gate signal $V_G$ puts the switching device IGBT in a conductive state, the current that has been flowing through the flywheel diode $D_F$ starts to decrease and, finally, a current flows in a negative direction, that is, from a cathode K to an anode A of the flywheel diode $D_F$. This negative current flow is attributed to movement of carriers accumulated in the diode $D_F$. As the number of carriers decreases, the absolute value of the negative current also starts to decrease to zero. Since this current also flows through the wire and the like having the parasitic inductance $L_L$, the reverse-direction voltage $V_D$ (or the voltage in a current blocking direction) of the diode $D_F$ increases with the decrease in absolute value of the current. As the reverse-direction voltage $V_D$ reaches the voltage value $V_1$, a current starts to flow, gradually reducing the rate of increase in $V_D$, the reverse-direction voltage.

The relation between the current and the voltage of the diode $D_F$ that prevails thereafter is the same as that of the switching device IGBT so that there is no need to repeat the explanation here. As a result, also in the case of the flywheel diode $D_F$, electromagnetic noise is by no means generated by vibration of the current and voltage. Further, the flywheel diode $D_F$ itself and circuit components connected in parallel thereto can thus be prevented from being damaged by an excessively large voltage.

Figure 3A:
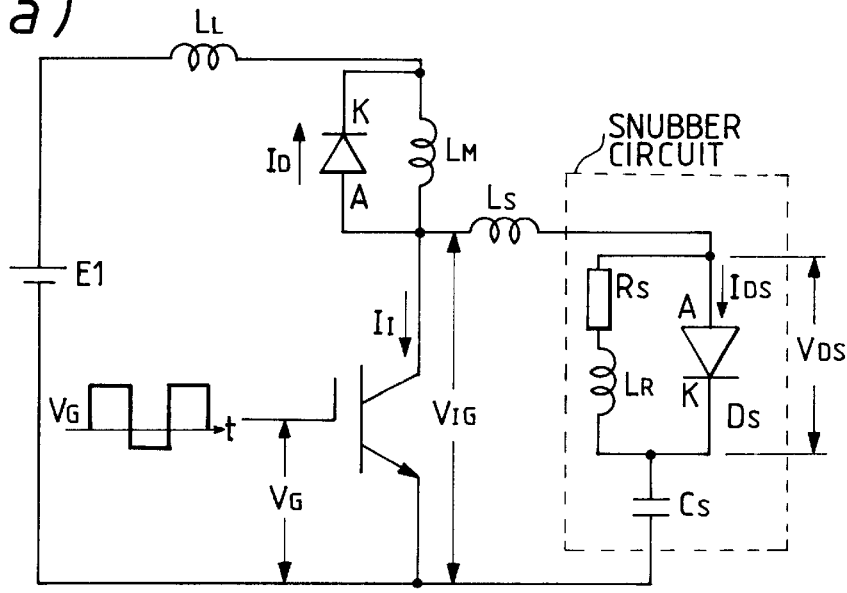
FIG. 3(a) is a circuit diagram showing another embodiment implementing the circuit provided by the present invention.
Figure 3B:
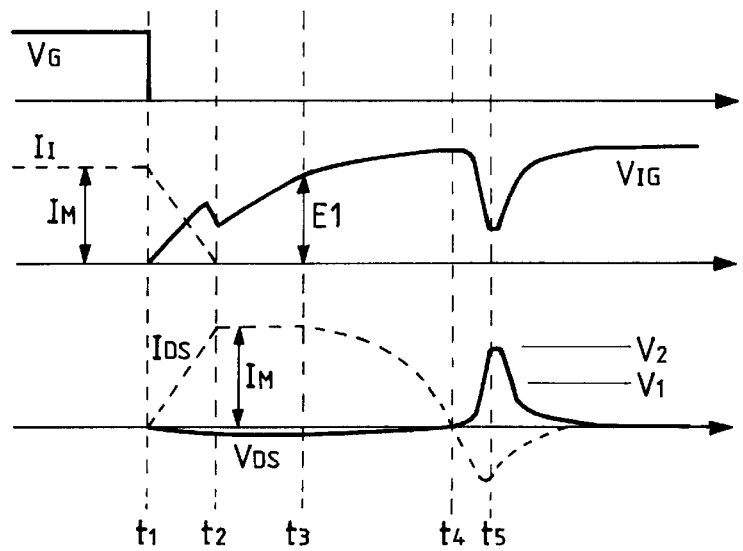
FIG. 3(b) shows waveforms appearing at a variety of locations in the circuit.

Next, another embodiment will be explained by referring to FIG. 3(a) and FIG. 3(b). Here, the operation of a snubber circuit to which the present invention is applied will be explained. During a period from a point of time $t_1$ to a point of time $t_2$ in which the voltage $V_G$ of the gate of the switching device IGBT is reduced to 0V, a current $I_I$ that has been flowing through the switching device IGBT is decreasing, as shown in FIG. 3(b). Since the current $I_I$ is also flowing through the wire and the like having the parasitic inductance $L_L$ as well as through an external load having the inductance $L_M$, however, the current $I_I$ can not decrease abruptly. As a result, a current $I_{DS}$ flows through an inductance $L_S$ and a diode $D_S$, which form a detour, precharging the capacitor $C_S$. At the point of time $t_2$, at which the current $I_I$ becomes zero, a current $I_M$ that was initially flowing through the switching device IGBT now flows through the detour as the current $I_{DS}$. Therefore, at the point of time $t_2$, the magnitude of the current $I_{DS}$ is equal to the current $I_M$. Since the current $I_{DS}$ precharges the capacitor $C_S$, on the other hand, a voltage $V_{IG}$ between the terminals of the switching device IGBT increases gradually.

At a point of time $t_3$, at which the terminal voltage $V_{IG}$ reaches the voltage E1 of the power supply, the diode $D_F$ connected in parallel to the inductance load $L_M$ is turned on, causing the current $I_{DS}$ which has been flowing through the snubber diode $D_S$ to start to decrease. However, the current $I_{DS}$ can not decrease abruptly due to the effect of the parasitic inductance $L_L$ and the inductance $L_S$ of a wire of the snubber circuit. As a result, the current $I_{DS}$ keeps flowing while decreasing in magnitude. For this reason, the voltage between the terminals of the capacitor $C_S$ and the voltage $V_{IG}$ between the terminals of the switching device IGBT exceed the voltage E1 of the power supply.

At a point of time $t_4$, at which the current $I_{DS}$ becomes zero, the voltage of the capacitor $C_S$ is higher than the voltage E1 of the power supply, causing a current to flow from the capacitor $C_S$ to the power supply. As a result, a voltage is applied to the diode $D_S$ in the reverse direction. During a conductive state, carriers are accumulated in the diode $D_S$. The carriers are, however, swept out as a reverse-direction current. The reverse-direction current flows, increasing the magnitude thereof. At a point of time $t_5$, the number of carriers in the diode $D_S$ has decreased, creating a depletion layer in the diode $D_S$. As a result, the reverse-direction current flowing through the diode $D_S$ stops increasing, and starts to decrease abruptly.

At that time, the more abrupt the decrease in reverse-direction current, the more the potential of the anode A of the diode $D_S$ is pulled down by the inductances $L_L$ and $L_S$. That is to say, the reverse-direction voltage (the voltage in the current blocking direction) $V_{DS}$ of the diode $D_S$ increases. As the voltage $V_{DS}$ reaches the voltage value $V_1$, a current starts to flow, reducing the rate of increase in reverse-direction voltage $V_{DS}$ gradually. The relation between the reverse-direction current and the reverse-direction voltage of the diode $D_S$ that prevails thereafter is the same as that of the switching device IGBT so that there is no need to repeat the explanation here. As a result, also in the case of the snubber diode $D_S$, electromagnetic noise is by no means generated by oscillation of the current and voltage. Moreover, the snubber diode $D_S$ itself and circuit components connected in parallel thereto can be prevented from being damaged by an excessively large voltage.

The differential resistance for blocking-direction voltages between the first and second voltage values plays a role of absorbing energy accumulated in the parasitic inductance, whereas the smaller differential resistance for blocking-direction voltages above the second voltage value $V_2$ plays a role of limiting a further increase in voltage. In the case of the present embodiment, however, it is not always necessary to provide the second voltage value and to reduce the differential resistance for blocking-direction voltages above the second voltage value. In the case of a circuit comprising elements which can well stand against a breakdown voltage, for example, it is not necessary to provide a means for limiting the increase in voltage and, thus, it is not always necessary to reduce the differential resistance for blocking-direction voltages higher than the second voltage value.

Since the differential resistance for blocking-direction voltages higher than the first voltage value absorbs energy accumulated in the parasitic inductance, it is most desirable to set the differential resistance at a value that can well suppress vibration of the voltage and current. Next, the most desirable value of the differential resistance for blocking-direction voltages higher than the first voltage value will be explained by referring to FIG. 4(a) through FIG. 4(d).

For example, when the switching device IGBT is turned off, it equivalently appears as a capacitor. The oscillation of the voltage and current results from a resonance phenomenon caused by the parasitic inductance $L_L$ of the wire and the like and the equivalent capacitance of the turned-off switching device IGBT. Typically, the switching device IGBT is made of a semiconductor and when a depletion layer widens inside the switching device, the circuit current is cut off. With the depletion layer widened, the switching device IGBT functions as a capacitor which causes a resonance phenomenon along with the inductance existing in the circuit. Thus, in order to prevent the resonance phenomenon from occurring, it is necessary to provide a resistive component while the inductance is accumulating energy so that the switching device IGBT does not fully function as a capacitor. The current-voltage characteristic of the present invention shown in FIG. 1 addresses this problem, indicating that the switching element IGBT has a resistive component at blocking-direction voltages higher than the first voltage value $V_1$.

Figure 4A:
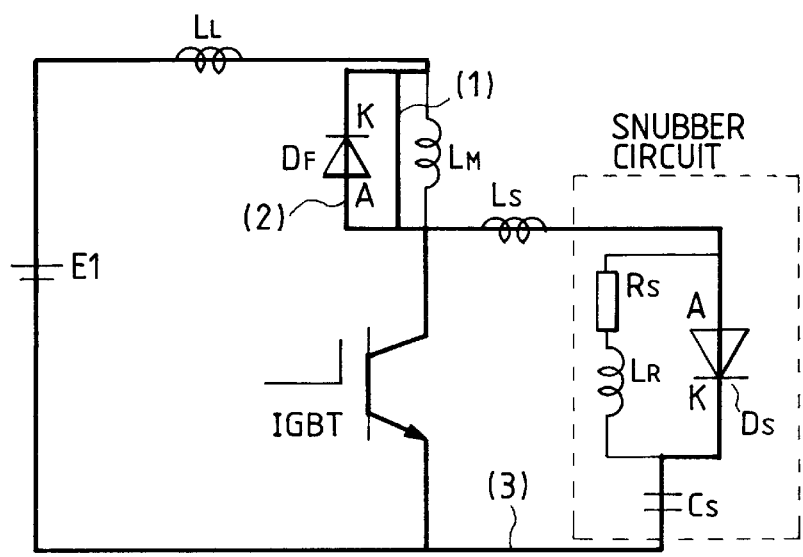
FIGS. 4(a) to 4(d) are circuit diagrams used for explaining effects provided by the present invention.

In the semiconductor circuit shown in FIG. 4(a), there are three circuit loops that give rise to resonance phenomena. The first circuit loop causes a resonance phenomenon when the switching device IGBT transits from an on state to an off state. This first circuit loop comprises the power supply E1, the parasitic inductance $L_L$, the flywheel diode $D_F$ that does not produce a voltage drop, the load inductance $L_m$ and the switching device IGBT. This first circuit loop can be represented by an equivalent circuit like the one shown in FIG. 4(b). As is shown in the figure, the equivalent circuit does not include the power supply E1 because the power supply E1 does not have an effect on a high-frequency oscillation phenomenon, such as resonance. Notation R shown in the figure denotes the resistance of the wire, whereas notation $R_I$ is the resistive component for blocking-direction voltages higher than the first voltage value $V_1$. In this way, the resistance $R_I$ is connected in parallel to the capacitor $C_I$ inherently existing in the switching device IGBT. The resistance $R_I$ absorbs energy accumulated in the parasitic inductance $L_L$, playing a role of suppressing vibration of the current and voltage.

The second circuit loop gives rise to a resonance phenomenon when the switching device IGBT transits from an off state to an on state. At that time, the flywheel diode $D_F$ exhibits a recovery characteristic. eventually appearing as a capacitor which causes a resonance phenomenon in conjunction with the parasitic inductance $L_L$. This second circuit loop comprises the power supply E1, the parasitic inductance $L_L$, the flywheel diode $D_F$ and the switching device IGBT. This second circuit loop can be represented by an equivalent circuit like the one shown in FIG. 4(c). As is shown in the figure, the second circuit loop comprises the parasitic inductance $L_L$, a capacitance $CD_F$ which the flywheel diode $D_F$ inherently has, a differential resistance $R_{DF}$ which the flywheel diode $D_F$ has for blocking-direction voltages higher than the first voltage $V_1$ and a resistance R of the wire and the switching device IGBT. Also, in the case of the second circuit loop, its equivalent circuit shown in FIG. 4(c) has exactly the same configuration as that shown in FIG. 4(b). The differential resistance $R_{DF}$ developed for blocking-direction voltages higher than the first voltage value suppresses oscillation of the current and voltage.

The third circuit loop gives rise to a resonance phenomenon produced by the snubber circuit after some time has lapsed since the transition of the switching device IGBT from an on state to an off state. After some time has lapsed since the turning-off of the switching device IGBT, the voltage of the snubber capacitor $C_S$ becomes higher than the voltage E1 of the power supply due to the effects of the parasitic inductance $L_L$ and a parasitic inductance $L_S$ of the snubber circuit. As a result, a current starts to flow from the snubber capacitor $C_S$ to the power supply via the snubber diode $D_S$, causing the snubber diode $D_S$ to eventually appear as a capacitor which causes a resonance phenomenon in conjunction with the parasitic inductances $L_L$ and $L_S$. As shown in FIG. 4(a), the snubber circuit includes the snubber resistor $R_S$ and the snubber capacitor $C_S$. Since a parasitic inductance $L_R$ is connected in series to the snubber resistor $R_S$, however, the snubber resistor $R_S$ is not included in the equivalent circuit due to the fact that the impedance of the inductance $L_R$ is large for the resonance phenomenon. In addition, being much larger than the capacitance of an ordinary snubber diode, normally 1,000 to 10,000 times as much, the snubber capacitor $C_S$ is also excluded from the equivalent circuit as well.

For the reasons described above, a circuit shown in FIG. 4(d) is obtained as an equivalent circuit of the third circuit loop. Notation R shown in the figure denotes the parasitic resistance of the wire and the snubber capacitor, whereas reference notation $C_{DS}$ is the capacitance that the snubber diode $D_S$ inherently has. Notation $R_{DS}$ is a differential resistance for blocking-direction voltages higher than the first voltage value. Notation $L_S$ is the parasitic inductance and also includes the parasitic inductance $L_L$. Much like the equivalent circuit shown in FIG. 4(d), the differential resistance $R_{DS}$ developed for blocking-direction voltages higher than the first voltage value $V_1$ also suppresses oscillation of the current and voltage.

Next, both the existence of the differential resistors $R_I$, $RD_F$ and $RD_S$ for suppressing the resonance phenomena generated by the parasitic inductances and a range of most effective values of the differential resistors $R_I$, $R_{DF}$ and $R_{DS}$ for suppressing the oscillation will be explained. The explanation is given with reference to FIG. 4(b).

The differential resistance $R_I$ for blocking-direction voltages higher than the first voltage value exhibits an effect of suppressing a resonance phenomenon when the differential resistance $R_I$ has a value smaller than the impedance of the capacitor $C_I$ that the switching device IGBT basically includes. That is to say, when ω is the resonance frequency of the equivalent circuit shown in FIG. 4(b), the following equation can be established:

$$R_I \leq 1/\omega C_I \quad \text{(Exp. 1)}$$

On the other hand, in the range where the value of the differential resistance $R_I$ is smaller than the electrical resistance R of the wire, the effect of the differential resistance $R_I$ on the suppression of the resonance phenomenon is also smaller than that of the electrical resistance R. It is thus necessary to have a differential resistance $R_I$ with a value greater than the electrical resistance R. For these reasons, in order to effectively suppress the resonance phenomenon, it is necessary to have a differential resistance $R_I$ with a value set in the following equation:

$$R \leq R_I \leq 1/\omega C_I \quad \text{(Exp. 2)}$$

Figure 4B:
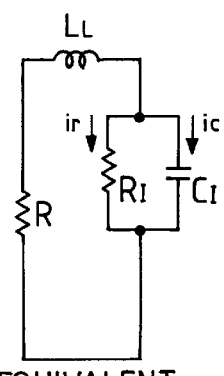
Figure 4C:
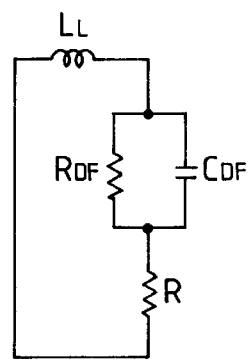
Figure 4D:
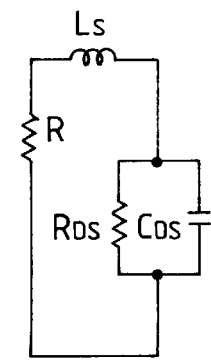

An actual value of the resonance frequency ω is found from FIG. 4(b). Since the resonance frequency ω determines the upper limit of the differential resistance Ri, the electrical resistance R of the wire can be ignored in finding the resonance frequency ω. That is to say, the value of the resonance frequency ω is found by solving the following differential equations:

$$L_L(di_r/dt) + L_L(di_c/dt) + (1/C_I)\int i_c dt = 0 \quad \text{(Exp. 3)}$$

$$(1/C_I)\int i_c dt = i_r \cdot R_I \quad \text{(Exp. 4)}$$

Solving the above differential equations yields a resonance frequency ω expressed by the following equation:

$$\omega = [1/(L_L \cdot C_I) - (\tfrac{1}{4})\{1/(R_I \cdot C_I)\}^2]^{1/2} \quad \text{(Exp. 5)}$$

Substituting the above expression into Exp. 2 results in a range of the differential resistor $R_I$ as follows:

$$R \leq R_I \leq \{(5/4) \cdot (L_L/C_I)\}^{1/2} \quad \text{(Exp. 6)}$$

As described above, the current-voltage characteristic shown in FIG. 1 is effective in the suppression of the resonance phenomenon. Next, an embodiment for implementing the current-voltage characteristic shown in FIG. 1 will be explained in concrete terms as follows.

Figure 5:
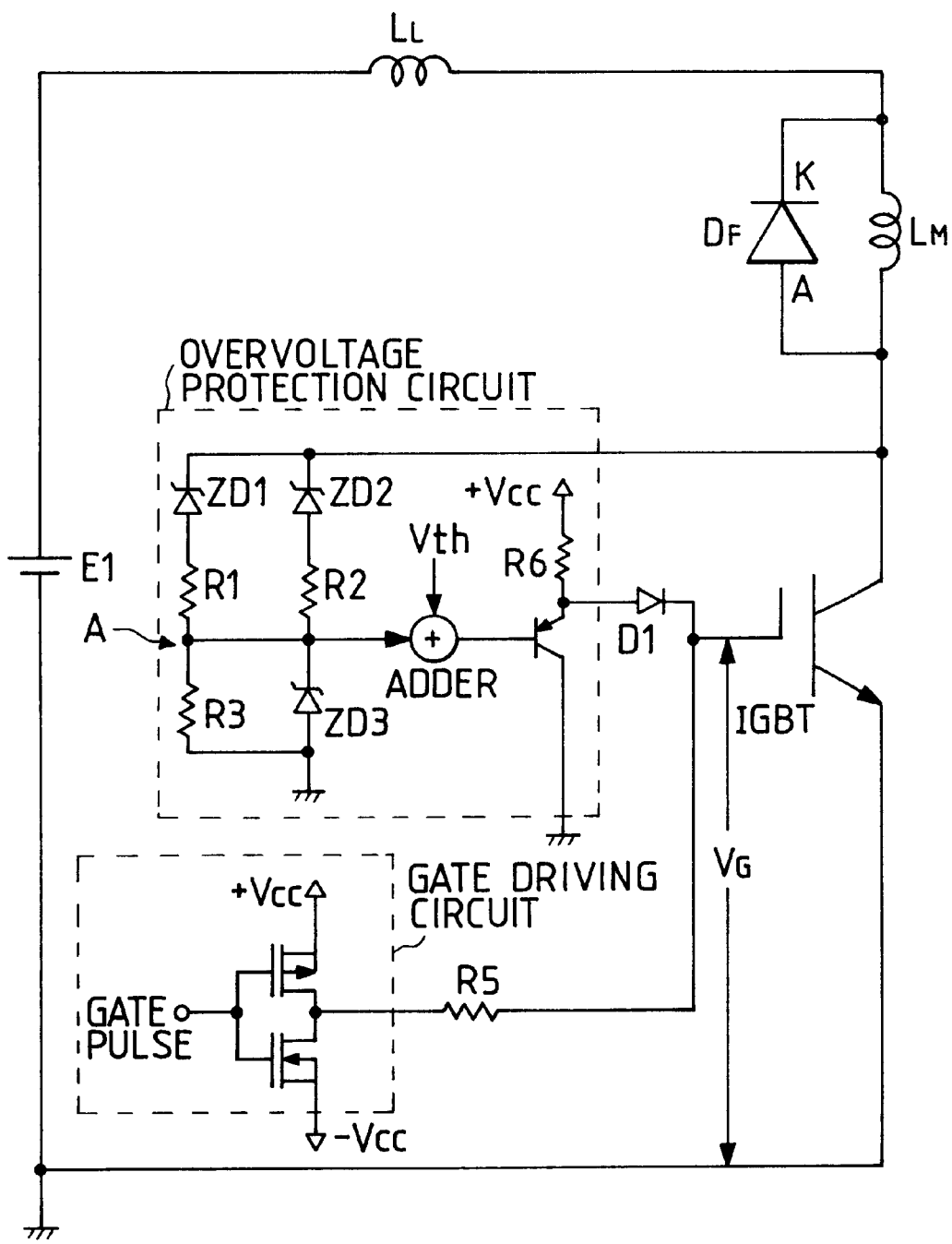
FIG. 5 is a circuit diagram showing a semiconductor circuit including an IGBT and an overvoltage protection circuit connected thereto, which semiconductor circuit implements the characteristic shown in FIG. 1 to an IGBT.

FIG. 5 shows a semiconductor circuit employing a switching device IGBT, which circuit exhibits the current-voltage characteristic, shown in FIG. 1. As shown in FIG. 5, the semiconductor circuit includes the switching device IGBT and an overvoltage protection circuit connected to the switching device IGBT. Even though the switching device shown in the figure is an IGBT, in the case of this embodiment, the switching device does not have to be an IGBT. Another switching device that shows a saturation characteristic, such as a MOSFET, can also be employed as the switching device as well. In this embodiment, the overvoltage protection circuit comprises avalanche diodes ZD1, ZD2 and ZD3 and resistors R1 to R3. The avalanche diodes ZD1 and ZD2 are selected so as to satisfy the conditions $V_1 \leq V_2$, where $V_1$ and $V_2$ are the breakdown voltages of the avalanche diodes ZD1 and ZD2, respectively. The avalanche diode ZD3 is incorporated to prevent a high voltage from being applied to the gate electrode of the switching device IGBT. The breakdown voltage of the avalanche diode ZD3 is set at a value lower than the withstand voltage between the gate and emitter electrodes. In the case of a switching device with a breakdown voltage in the range of several hundreds to several thousands of volts, it is desirable to set the breakdown voltage of the avalanche diode ZD3 to a typical value in the order of 30V.

When a gate signal generated by a gate driving circuit goes below the threshold voltage of the switching device IGBT, the switching device TGBT enters an off state, raising the collector voltage Vc thereof. As the collector voltage $V_C$ of the switching device IGBT becomes equal to the breakdown voltage value $V_1$ of the avalanche diode ZD1, a current flows through the avalanche diode ZD1, raising the voltage $V_A$ of a point A shown in the figure. An adder outputs a voltage equal to the sum of the voltage $V_A$ and the threshold voltage of the switching device IGBT. The voltage output by the adder is applied to the switching device IGBT through a buffer amplifier comprising a transistor and a diode. As the collector voltage $V_C$ reaches the first voltage value $V_1$, a collector current starts to flow. It should be noted that the adder can be of any configuration. Typically, an adder employing a generally known operational amplifier is used. The transistor is employed for reducing the output impedance of the overvoltage protection circuit and for increasing the gate control power for controlling the switching device IGBT. Another device can be used as a substitute for the transistor as long as the device has sufficient control power.

In the embodiment provided by the present invention, the voltage $V_A$ at the point A is determined by the ratio of the resistance of the resistor R1 to the resistance of the resistor R3 and has the relation as expressed by the following equation:

$$V_A = \{R3/(R1+R3)\} \cdot V_C = \alpha \cdot V_C \quad (\text{Exp. 7})$$

where notation $V_c$ is the collector voltage.

Accordingly, the gate voltage $V_G$ is given by Exp. 8 as follows:

$$V_G = V_A + V_{th} = \{R3/(R1+R3)\} \cdot V_C + V_{th} = \alpha \cdot V_C + V_{th} \quad (\text{Exp. 8})$$

What is indicated by the above equation is that, once the collector voltage $V_C$ has exceeded the first voltage value $V_1$, the rate of increase of the gate voltage $V_G$ of the switching device IGBT can be controlled by varying a resistance ratio a used in Exp. 7. In addition, since the rate of increase of the gate voltage $V_G$ can be reduced by decreasing the resistance ratio $\alpha$, the gate voltage $V_G$ by no means increases abruptly as is the case with the conventional dynamic clamping technique. The saturated value $I_{csat}$ of the collector $I_C$ is expressed by the following equation:

$$I_{csat} = g(V_G - V_{th})^2 \quad (\text{Exp. 9})$$

where notation g is a constant determined by the structure of the device. Substituting Exp. 8 into Exp. 9 results in Exp. 10 as follows:

$$I_{csat} = g \cdot \alpha^2 \cdot V_C^2 \quad (\text{Exp. 10})$$

In the embodiment, the resistance ratio $\alpha$ can be determined freely. By setting the resistance ratio a at a sufficiently small value, a collector current that gradually increases with the collector voltage $V_C$ can thus be obtained.

As the collector voltage $V_C$ further increases so that the voltage applied to the avalanche diode ZD2 attains the breakdown voltage value $V_2$ thereof, the avalanche diode ZD2 enters a conductive state, raising the rate of increase of the voltage $V_A$ at the point A. The voltage $V_A$ which appears at the point A after the breakdown voltage value $V_2$ is exceeded is expressed by the following equation:

$$V_A = [(R3/\{(R1 \cdot R2)/(R1+R2)+R3\}] \cdot V_C = \beta \cdot V_C \quad (\text{Exp. 11})$$

Thus, the collector current IC is expressed by the following equation:

$$I_{csat} = g \cdot \beta^2 \cdot V_C^2 \quad (\text{Exp. 12})$$

Since the relation $\alpha \leq \beta$ always holds true for $\alpha$ and $\beta$, which are determined by the resistance ratios, the rate of increase of the collector current $I_C$ for collector voltages higher than the breakdown voltage $V_2$ is greater than the rate of increase for collector voltages between the first and second voltage values $V_1$ and $V_2$. As a result, the voltage-current characteristic of FIG. 1 can be realized. It should be noted that, even though the circuit shown in FIG. 5 does not include a snubber circuit, a circuit configuration incorporating a snubber circuit will also work as well without giving rise to any problems.

FIG. 6(a) and FIGS. 6(c) through 6(e) show embodiments of circuits employing diodes and a switching device, which circuits can be used for implementing the current-voltage characteristic depicted in FIG. 1. The diode circuits shown in FIGS. 6(a), 6(c) and 6(d) can be used as a diode for obtaining the current-voltage characteristic shown in FIG. 1, whereas the circuit of FIG. 6(e), which comprises an ordinary IGBT and one of the diode circuits connected in parallel to the IGBT, can serve as a switching device for obtaining the current-voltage characteristic shown in FIG. 1.

Figure 6A:
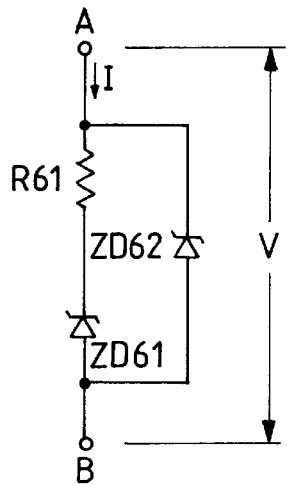
Figure 6B:
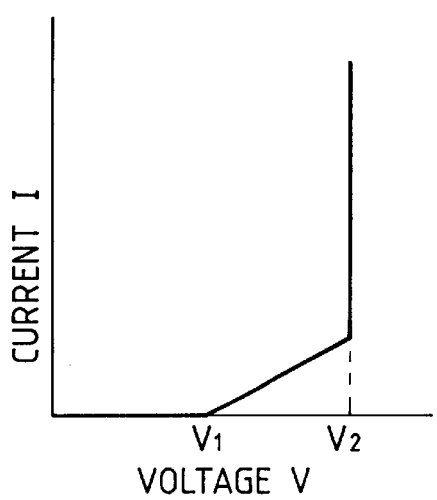
FIG. 6(b) shows a current-voltage characteristic between terminals A and B of the embodiments.
Figure 6C:
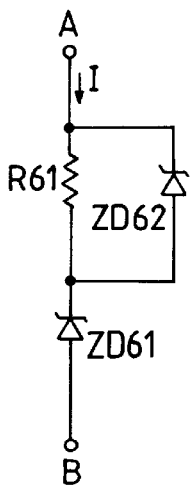
Figure 6D:
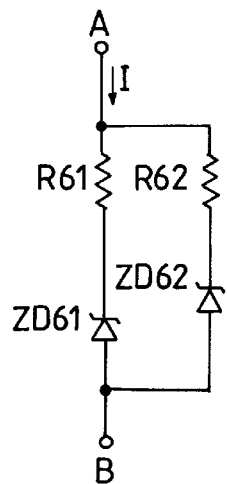
Figure 6E:
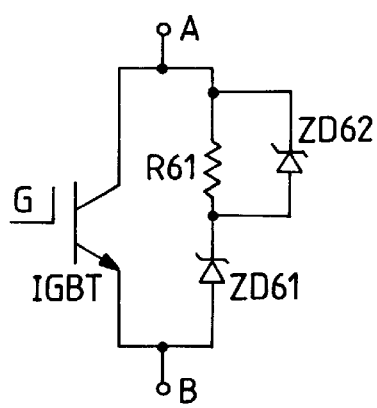

An embodiment with a configuration comprising avalanche diodes ZD61 and ZD62 and a resistor R61 is shown in FIG. 6(a), whereas a current-voltage characteristic between terminals A and B of the embodiment is shown in FIG. 6(b) The avalanche breakdown voltage of the avalanche diode ZD61 is set at the first voltage value $V_1$, while the avalanche breakdown voltage of the avalanche diode ZD62 is set at the second voltage value $V_2$. When the voltage V between the terminals A and B reaches the first voltage value $V_1$, a current flows through the avalanche diode ZD61. Since the current experiences the resistance of the resistor R61, the rate of increase of the current I between the terminals A and B is moderate. When the voltage V between the terminals A and B further increases, attaining the second voltage value $V_2$, a current flows through the avalanche diode ZD62. At that time the current I abruptly increases. In this way, the circuit shown in FIG. 6(a) also results in the same current-voltage characteristic as the one shown in FIG. 1. The operation of the circuit shown in FIG. 6(c) should be apparent, and so it is omitted here. It should be noted, however, that the circuit shown in FIG. 6(c) also provides a current characteristic similar to the one shown in FIG. 6(b).

In addition, the differential resistance for blocking-direction voltages greater than the second voltage value $V_2$ can have any value greater than zero as long as the value is smaller than the differential resistance for blocking-direction voltages between the first and second voltage values $V_1$ and $V_2$. Such differential resistances can be implemented typically by the circuit shown in FIG. 6(d). It is required, however, that the resistance of a resistor R61 be equal to or greater than the resistance of a resistor R62. In addition, a modified configuration of the circuit shown in FIG. 6(d) in which the anode terminal of the avalanche diode ZD62 is connected to the junction , point between the resistor R61 and the avalanche diode ZD61 will also work as well. On the top of that, it is needless to say that any of these circuits, each having a configuration comprising resistors and diodes, can be connected in parallel to another device or circuit, such as a switching device like an IGBT or a diode, to form a parallel circuit configuration like the one shown in FIG. 6(e), which parallel circuit configuration will also work as well.

Figure 7A:
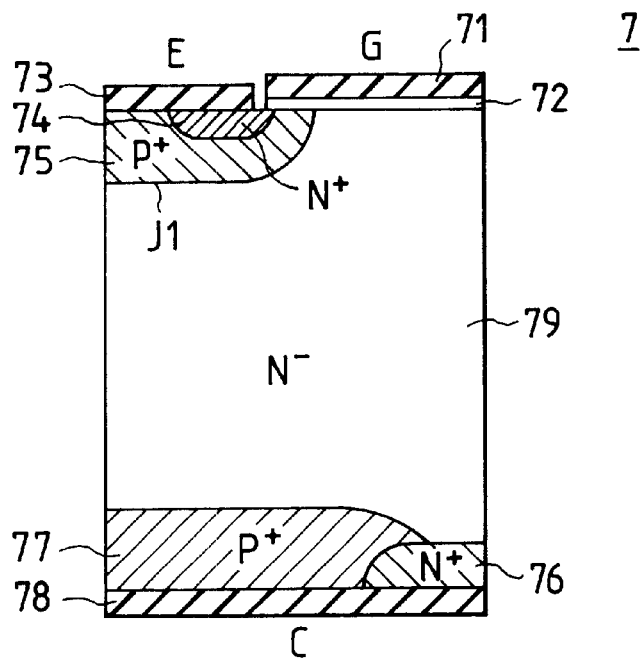
Figure 7B:
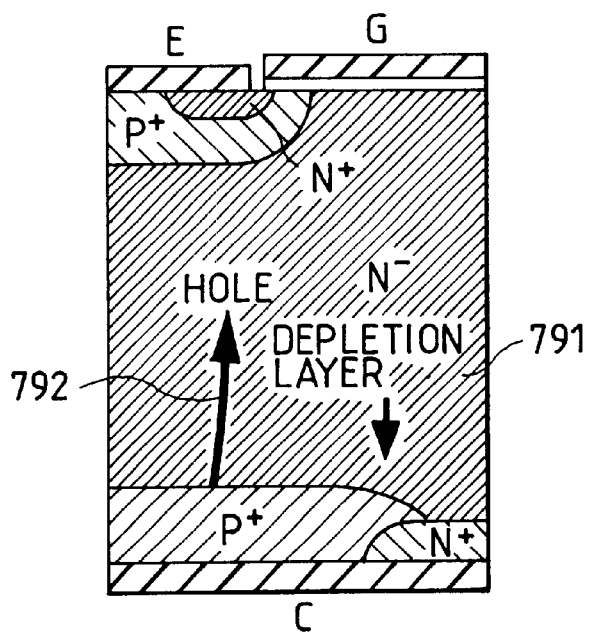
FIG. 7(b) is a diagram used for explaining the operation thereof.

The current-voltage characteristic shown in FIG. 1 can also be implemented in the structure of a semiconductor device itself, such as a switching device or a diode. An embodiment of such a semiconductor device will be described with reference to FIG. 7(a) and FIG. 7(b). An IGBT serving as a switching device to which the present invention is applied is shown in FIG. 7(a). FIG. 7(b) is a diagram used for explaining the operation of the IGBT shown in FIG. 7(a). In the case of the present IGBT, a so-called collector-short structure is adopted on the collector side.

When a positive voltage is applied to a collector electrode 78 of the IGBT with the gate voltage set at a value lower than the threshold voltage, a depletion layer 791 widens from a junction J1 between a P$^+$ conductivity type semiconductor region 75 and an N$^-$ conductivity type semiconductor layer 79 toward the collector electrode 78. Since the P$^+$ conductivity type semiconductor layer 77 is protruding more than the N$^+$ conductivity type semiconductor layer 76 is, the depletion layer 791 reaches the P$^+$ conductivity type semiconductor layer 77 first. As the depletion layer 791 reaches the P$^+$ conductivity type semiconductor layer 77 of the collector electrode 78, holes 792 start to flow from the P$^+$ conductivity type semiconductor layer 77 to an emitter electrode 73. That is to say, at a voltage value $V_1$ at which the depletion layer 791 reaches the P$^+$ conductivity type semiconductor layer 77, a current starts to flow.

When the collector voltage is further increased, the number of holes injected from the P$^+$ conductivity type semiconductor layer increases, raising the collector current little by little. Since the holes 792 create electrons and holes at a location in close proximity to the junction J1 in the depletion layer where the electric field has a maximum intensity, the created electrons and holes further generate electrons and holes in the depletion layer as the number of holes 792 reaches a certain value. As a result, the number of electrons and holes increases abruptly, giving rise to a so-called avalanche breakdown The collector voltage at which the avalanche breakdown occurs is the voltage $V_2$.

In this way, with the present embodiment, the current-voltage characteristic shown in FIG. 1 can also be obtained as well, allowing the use of a device provided by the present invention to suppress the occurrence of a resonance phenomenon of the current and voltage and to prevent an excessively large voltage from being generated. It should be noted that the layers 74 and 76 are N$^+$ conductivity type layers, as described above, while reference numeral 72 is an isolation film made of silicon oxide or the like.

Figure 8:
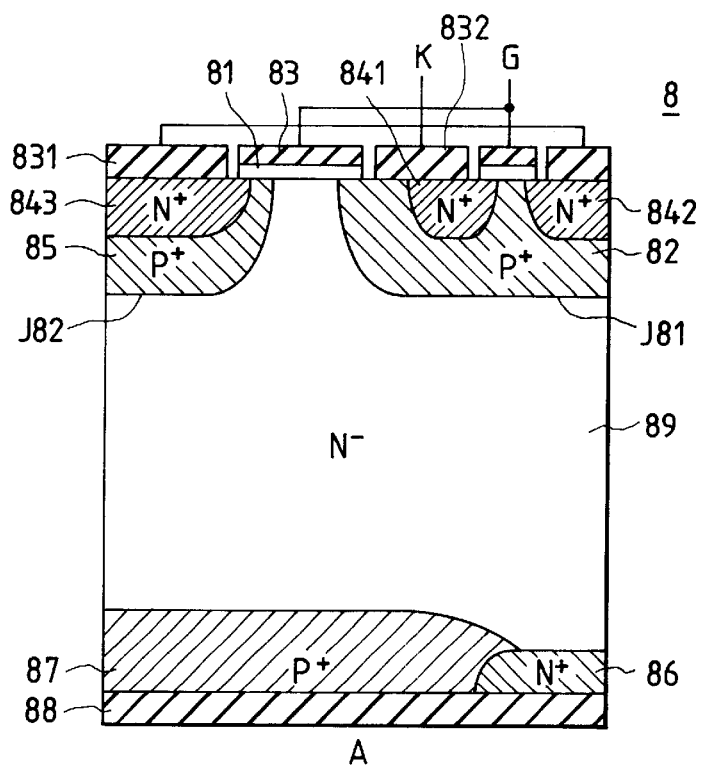
FIG. 8 is a diagram which shows another embodiment implementing a switching device to which the present invention is applied.

Another embodiment of the switching device provided by the present invention is shown in FIG. 8. Much like the embodiment shown in FIG. 7(a), the present embodiment also has a anode-short structure identical with that shown in FIG. 7(a). In the case of this device, when a voltage higher than the threshold voltage is applied to a gate electrode 83, an N$^+$ conductivity type semiconductor layer 841, an N$^+$ conductivity type semiconductor layer 842, an N$^+$ conductivity type semiconductor layer 843 and an N$^-$ conductivity type semiconductor layer 89 are linked by an n$^-$ type inversion layer, causing electrons to be injected from the N$^+$ conductivity type semiconductor layer 843 and holes to be injected from a P$^+$ conductivity type semiconductor layer 87 to the N$^-$ conductivity type semiconductor layer 89. In this state, a turn-on operation is carried out. As the voltage applied to the gate electrode 83 is reduced to a level lower than the threshold voltage, on the other hand, the n-type inversion layer is closed, halting the injection of electrons and holes at the same time. In this state, the switching device 8 is turned off.

By the way, when the switching device 8 implemented by the present embodiment is in an off state, applying a positive voltage to an anode electrode 88 will cause a depletion layer to widen from a junction J82 between a P$^+$ conductivity type semiconductor layer 85 and an N$^-$ conductivity type semiconductor layer 89 and a junction J81 between a P$^+$ conductivity type semiconductor layer 82 and an N$^-$ conductivity type semiconductor layer 89 toward the anode electrode 88. As the depletion layer reaches a P$^+$ conductivity type semiconductor layer 87, holes are injected toward a cathode electrode 832. The number of injected holes increases with an increase in anode voltage. That is to say, the anode current increases with an increase in anode voltage. As the anode voltage reaches the voltage value $V_2$, an avalanche breakdown occurs due to the injected holes at a location in close proximity to the junction J81 as is the case with the embodiment shown in FIG. 7(a). As a result, the anode current increases abruptly. In this way, with the present embodiment, the current-voltage characteristic shown in FIG. 1 can also be obtained as well, allowing the use of the device implemented by the present embodiment to suppress the occurrence of a resonance phenomenon of the current and voltage and to prevent an excessively large voltage from being generated.

Figure 9:
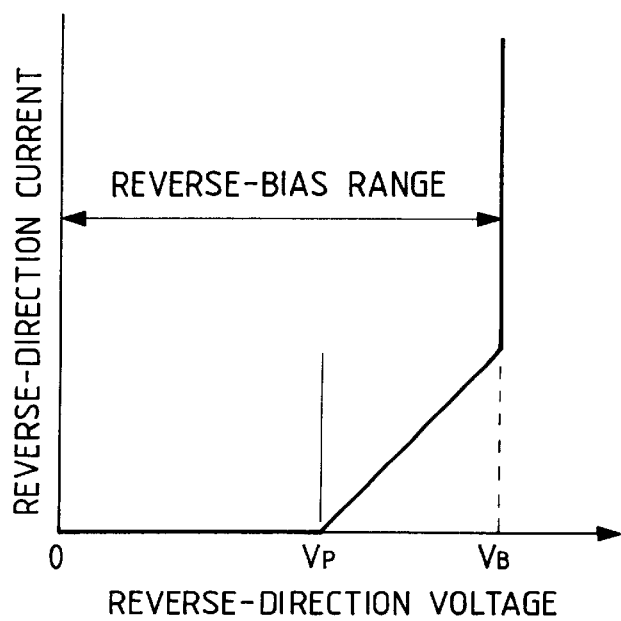
FIG. 9 is a diagram which shows a reverse-direction current-voltage characteristic of a diode to which the present invention is applied.
Figure 10A:
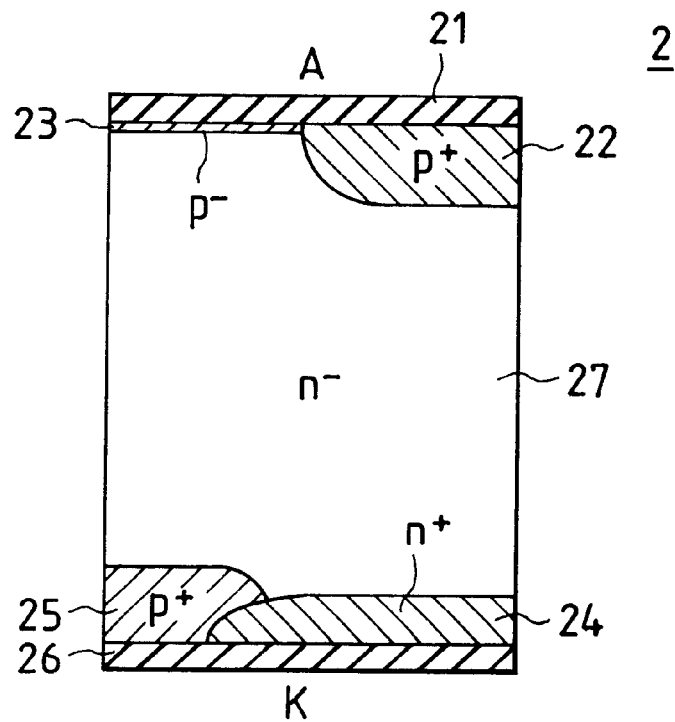
FIGS. 10(a) and 10(b) are diagrams which show device structures of a diode to which the present invention is applied.
Figure 10B:
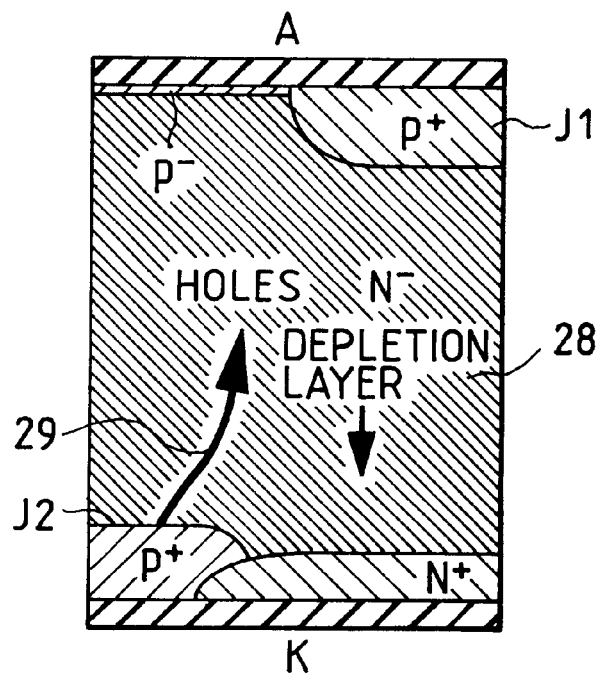
Figure 11:
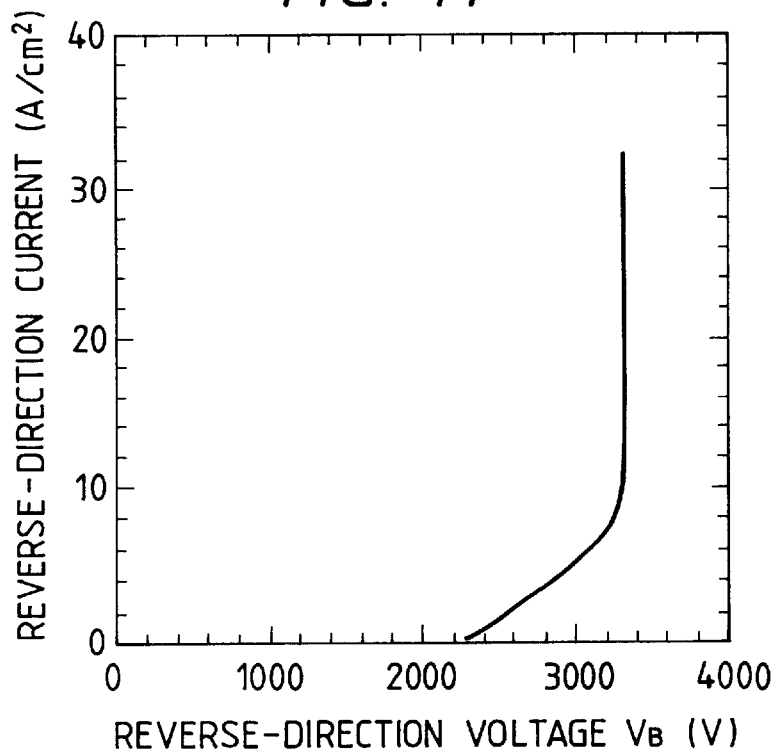
FIG. 11 is a diagram which shows a reverse-direction current-voltage characteristic of a diode with a structure shown in FIGS. 10(a) and 10(b)
Figure 12:
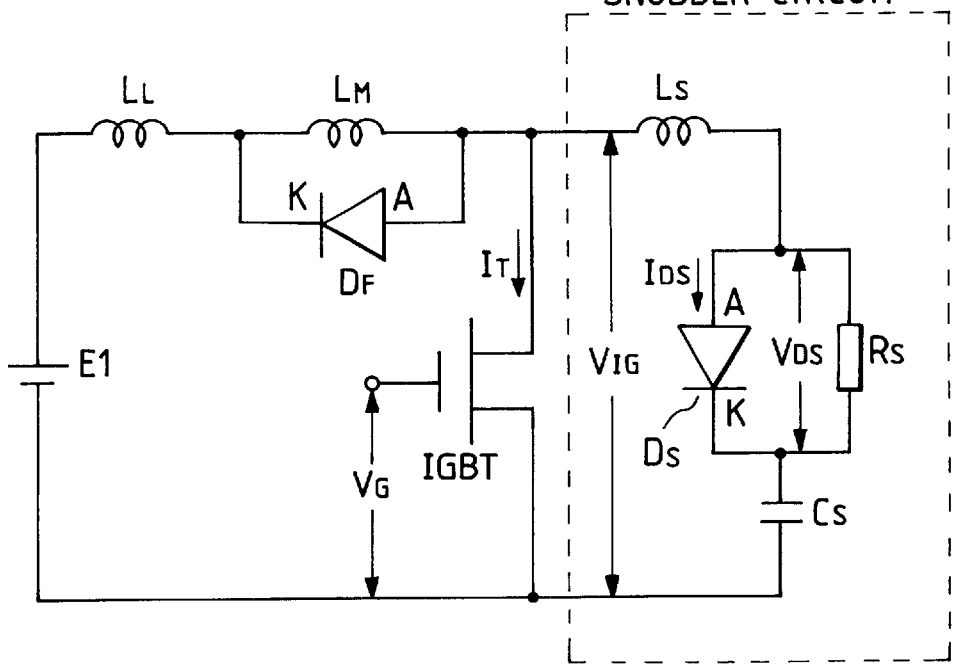
FIG. 12 is a circuit diagram of an embodiment implementing an actual application circuit to which the present invention is applied.

FIGS. 9 to 13 are views used for explaining embodiments provided by the present invention. FIG. 9 shows a reverse-bias range of a diode in which the present invention is implemented. FIG. 10(a) shows a cross-sectional structure of a diode implemented by an embodiment in accordance with the present invention. FIG. 10(b) is a diagram which shows a cross-sectional structure of the diode shown in FIG. 10(a), which diagram is used for explaining the operation of the diode. FIG. 11 shows a typical calculation result of the reverse-direction current-voltage characteristic exhibited by the diode shown in FIGS. 10(a) and 10(b). FIG. 12 shows a circuit in which the present invention is implemented. FIG.

13 shows current and voltage waveforms appearing at a variety of locations in the circuit shown in FIG. 12. Notation $V_P$ shown in FIG. 9 is a reverse-direction voltage at which a depletion layer 28 in the diode shown in FIGS. 10(a) and 10(b) punches through a p+ conductivity type semiconductor layer 25 whereas notation $V_B$ denotes a reverse-direction voltage at which an avalanche-breakdown phenomenon occurs in the diode due to a hole current 29. Reference numeral 2 in FIG. 10(a) generally designates an embodiment implementing a diode in accordance with the present invention. Reference numerals 27 and 22 are an n− conductivity type semiconductor layer and a p+ conductivity type semiconductor layer also referred to hereafter as 1st and 2nd semiconductor layers, respectively. Reference numeral 23 is a p− conductivity type semiconductor layer. Reference numerals 24 and 25 are an n+ conductivity type semiconductor layer and a p+ conductivity type semiconductor layer also referred to hereafter as 4th and 3rd semiconductor layers, respectively. Reference numerals 21 and 26 are anode and cathode electrodes also referred to hereafter as 1st and 2nd main electrodes, respectively. In addition, reference numerals 28 and 29 shown in FIG. 10(b) are a depletion layer and a hole current caused by a punch-through, respectively. Notation E1 shown in FIG. 12 denotes a direct-current power supply, whereas notations $L_L$ and $L_S$ are inductances of wires and the like. Notation $L_M$ is the inductance of a load, such as a motor and the like, while notation $R_S$ denotes a resistor. Notation $C_S$ is a capacitor whereas the notation IGBT (Isolated Gate Bipolar Transistor) designates a typical switching device. Notations $D_F$ and $D_S$ are diodes having a structure shown in FIGS. 10(a) and 10(b). Notations denoting currents and voltages used in FIG. 13 designate the same currents and voltages as those shown in FIG. 12.

In the present embodiments, a soft recovery characteristic is obtained because the diode has a reverse-direction current-voltage characteristic, as shown in FIG. 9, as will be described later. However, prior to the explanation of embodiments provided by the present invention, description will first be given of a diode with a structure shown in FIGS. 10(a) and 10(b) which has a reverse-direction current-voltage characteristic as shown in FIG. 9.

When a voltage is applied to the diode shown in FIGS. 10(a) and 10(b) in the reverse direction, that is, when the anode and cathode electrodes 21 and 26 are set at negative and positive potentials, respectively, the depletion layer 28 widens from a junction J1 between the n− conductivity type semiconductor layer 27 and the p+ conductivity type semiconductor layer 22. In the structure shown in FIGS. 10(a) and 10(b), it is assumed that the impurity concentration of the n− conductivity type semiconductor layer 27 is sufficiently small in comparison with that of the p+ conductivity type semiconductor layer 22 to cause the depletion layer 28 to widen to the n− conductivity type semiconductor layer 27. Since the width of the depletion layer 28 increases with the voltage applied in the reverse direction, applying a sufficiently large voltage in the reverse direction will cause the depletion layer 28 to reach a junction J2 between the n− conductivity type semiconductor layer 27 and the p+ conductivity type semiconductor layer 25. As the depletion layer 28 reaches the junction J2, a hole current 29 from the p+ conductivity type semiconductor layer 25 starts to flow in the depletion layer 28 because a positive voltage relative to the anode electrode 21 is applied to the cathode electrode 26. The voltage applied in the reverse direction at that time is denoted by notation $V_P$ in FIG. 9. As the voltage applied in the reverse direction is further raised, the magnitude of the flowing hole current 29 increases with an electric field in the depletion layer 28, causing the reverse-direction current to rise gradually. The hole current 29 generates electrons and holes at a location in close proximity to the junction J1 having the strongest electric field in the depletion layer 28. The generated electrons and holes further generate electrons and holes in the depletion layer 28 as the magnitude of the hole current 29 attains a certain value, causing the number of electrons and holes to increase abruptly in a phenomenon referred to as a so-called avalanche breakdown. The voltage at which this avalanche-breakdown phenomenon occurs is denoted by notation $V_B$. In the case of a diode having a structure with neither the p+ conductivity type semiconductor layer 25 existing nor the so-called punch-through current flowing, only electrons and holes generated by thermal excitation in the depletion layer serve as a trigger of the occurrence of an avalanche breakdown at a location in close proximity to the junction J1. Accordingly, the number of electrons and holes triggering the avalanche breakdown in such a diode is much smaller than that in the embodiment, requiring a stronger electric field for causing an avalanche breakdown. As a result, the reverse-direction voltage causing an avalanche breakdown is higher than that for the diode with a structure including the p+ conductivity type semiconductor layer 25, as is shown in FIGS. 10(a) and 10(b).

In the case of the diode implemented by the embodiment, by driving the diode with a voltage equal to or higher than the reverse-direction voltage which causes the reverse-direction current to start to flow due to a punch-through, a soft reverse recovery characteristic can be obtained.

The reverse-direction voltage $V_P$ at which the punch-through current starts to flow has to be equal to or lower than the avalanche-breakdown voltage $V_{BO}$ of the junction J1 with no punch-through current flowing. This is because, for a reverse-direction voltage $V_P$ equal to or greater than the avalanche-breakdown voltage $V_{BO}$, an avalanche-breakdown phenomenon would occur before a punch-through current flows. Next, a condition for a punch-through voltage $V_P$ having a magnitude smaller than that of the avalanche-breakdown voltage $V_{BO}$ will be described.

Since the electric field in the depletion layer becomes a maximum at a junction point on the junction J1, the avalanche-breakdown voltage $V_{BO}$ is determined by the electric field $\epsilon$ at this point, which is given by the following equation:

$$\epsilon = q \cdot Q / \epsilon_s \quad \text{(Exp. 13)}$$

where notation q is the amount of electric charge of an electron, notation Q is the number of impurities per unit area in one of the depletion layers widening in two directions with the junction J1 taken as a center and notation $\epsilon_s$ is the dielectric constant of the semiconductor material. In the case of a diode having a structure like the one shown in FIGS. 10(a) and 10(b), for example, the electric field $\epsilon_p$ when the depletion layer reaches the P+ conductivity type semiconductor layer 25 is given by the following equation:

$$\epsilon_p = q \cdot (Q_P) / \epsilon_s \quad \text{(Exp. 14)}$$

where notation $Q_P$ is the number of impurities per unit area in the N− conductivity type semiconductor layer 27.

In the case of a diode having a structure with no punch-through current flowing, on the other hand, an avalanche-breakdown phenomenon occurs when the electric field at locations in close proximity to the junction J1 reaches an electric field $\epsilon_m$ which gives rise to a normal avalanche breakdown. Accordingly, the current-voltage characteristic shown in FIG. 9, wherein a punch-through current flows at a blocking-direction voltage lower than the avalanche-breakdown voltage, is obtained when the electric field $\epsilon_p$ on the junction J1 expressed by Exp. 14 is smaller than the avalanche-breakdown electric field $\epsilon_m$. The condition as expressed by the following equation is required:

$$\epsilon_p = q \cdot (Q_P)/\epsilon_s \leq \epsilon_m \qquad \text{(Exp. 15)}$$

Accordingly, in order to make the punch-through voltage $V_P$ lower than the avalanche-breakdown voltage $V_{BO}$, it is necessary to suppress the number of impurities $Q_P$ in the N⁻ conduct ion type semiconductor layer 27 between the junctions J1 and J2, which may be satisfied with the following:

$$Q_P \leq (\epsilon_m) \cdot (\epsilon_s)/q \qquad \text{(Exp. 16)}$$

In the case of silicon, $\epsilon_m = 3 \times 10^5$ [V/cm], $\epsilon_s = 1.054 \times 10^{-12}$ [F/cm] and $q = 1.602 \times 10^{-19}$ [C]. Substituting these values to Exp. 16 results in the following:

$$Q_P \leq 1.974 \times 10^{12} (\text{cm}^{-2}) \qquad \text{(Exp. 17)}$$

Accordingly, it is necessary for the number of impurities $Q_P$ to satisfy the above expression.

A typical calculation result of the reverse-direction current-voltage characteristic of the diode shown FIGS. 10(a) and 10(b), which diode satisfies Exp. 17, is depicted in FIG. 11. As shown in FIG. 11, three regions are observed: (1) a region with no reverse-direction current flowing or a region with the voltage $V_B$ in the range 0 to 2,300 V, (2) a region with a reverse-direction current gradually increasing or a region with the voltage $V_B$ in the range 2,300 to 3,300 V and (3) a region with the reverse-direction current increasing abruptly or a region with the voltage $V_B$ approximately equal to 3,300 V. The distance from the junction J1 to the junction J2 is 400 μm and the impurity density of the N⁻ conductivity type semiconductor layer 27 is $1.9 \times 10^{13}$ cm⁻³. The ratio of the area of the P⁺ conductivity type semiconductor layer 25 to the area of the N⁺ conductivity type semiconductor layer 24 is ½. In the case of a diode satisfying these conditions, the number of impurities $Q_P$ in the N⁻ conductivity type semiconductor layer between the junctions J1 and J2 is given by the following:

$$Q_P = 1.9 \times 10^{13} \times 400 \times 10^{-4} = 7.6 \times 10^{11} (\text{cm}^{-2}) \qquad \text{(Exp. 18)}$$

a value satisfying Exp. 17 given above.

In addition, the relationship in the above equations (13 to 17) is similarly established with respect to an IGBT, also, to which the present invention is applied.

Figure 13:
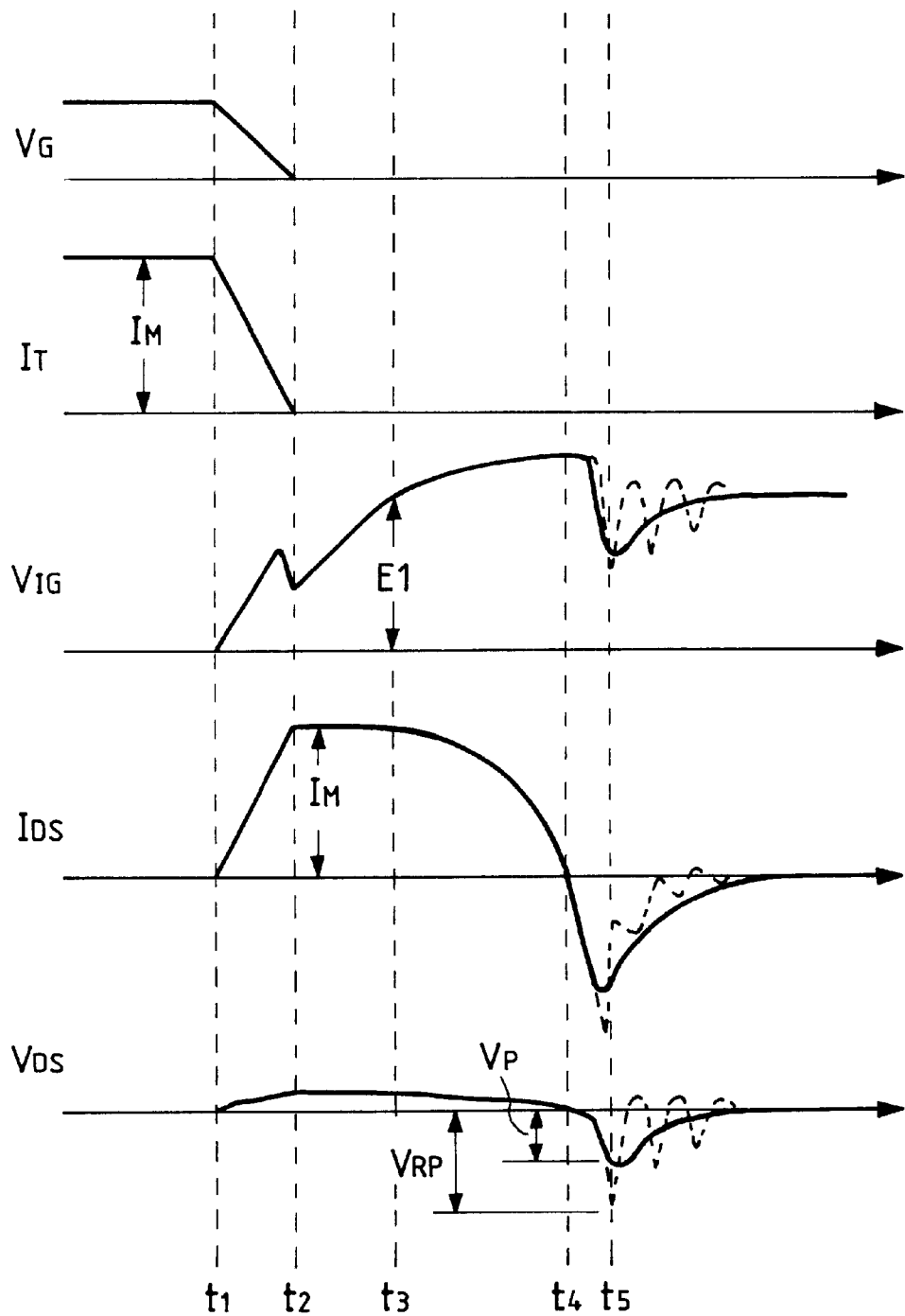
FIG. 13 is a waveform diagram showing switching waveforms of currents and voltages appearing at a variety of locations in the circuit shown in FIG. 12.

Next, the present embodiment will be explained in more detail by referring to the circuit shown in FIG. 12 as well as the current and voltage waveforms shown in FIG. 13. Here, the operation of a snubber circuit is explained. During a period from a point of time t1 to a point of time $t_2$ in which the gate voltage $V_G$ of a switching device IGBT is reduced to 0 V, as shown in FIG. 13, a current $I_T$ that has been flowing through the switching device IGBT is decreasing. However, the load current flowing through an external load, such as a motor having the inductance $L_M$, can not decrease abruptly. As a result, a current $I_{DS}$ flows through an inductance $L_S$ and a diode $D_S$, precharging the capacitor $C_S$. At the point of time $t_2$ at which the current $I_T$ becomes zero, a current $I_M$ that was initially flowing through the switching device IGBT now flows through the detour as the current $I_{DS}$. Therefore, at the point of time $t_2$, the value of the current $I_{DS}$ is equal to the current $I_M$. Since the current $I_{DS}$ precharges the capacitor $C_S$, on the other hand, a voltage $V_{IG}$, between the terminals of the switching device IGBT increases gradually.

At a point of time $t_3$ at which the terminal voltage $V_{IG}$ reaches the voltage E1 of the power supply, the diode $D_F$ connected in parallel to the inductance load $L_M$ is turned on, causing the current $I_{DS}$ which has been flowing through the snubber diode $D_S$ to start to decrease. However, the current $I_{DS}$ can not decrease abruptly due to the effect of the inductance $L_S$ of the wire of the snubber circuit. As a result, the current $I_{DS}$ keeps flowing while decreasing in magnitude. For this reason, the voltage between the terminals of the capacitor $C_S$ and the voltage $V_{IG}$ between the terminals of the switching device IGBT exceed the voltage E1 of the power supply.

At a point of time $t_4$ at which the current $I_{DS}$ becomes zero, the voltage of the capacitor $C_S$ is higher than the voltage E1 of the power supply, causing a current to flow from the capacitor $C_S$ to the power supply. As a result, a voltage is applied to the diode $D_S$ in the reverse direction. During a conductive state, carriers are accumulated in the diode $D_S$. The carriers are, however, swept out as a reverse-direction current. The reverse-direction current flows with increasing magnitude. At a point of time t5, the number of carriers in the diode $D_S$ has decreased, creating a depletion layer from the junction J1 shown in FIG. 10(a). As a result, the reverse-direction current flowing through the diode $D_S$ stops increasing, and starts to decrease abruptly instead. At that time, the more abrupt the decrease in reverse-direction current, the more the potential of the anode A of the diode $D_S$ is pulled down by the inductances $L_L$ and $L_S$. That is to say, the voltage $V_{DS}$ between the terminals of the diode $D_S$ substantially swings to the negative direction. The increase in inter-terminal voltage $V_{DS}$ in the negative direction causes the current flowing through the diode $D_S$ in the reverse direction to increase. As the current flowing through the diode $D_S$ in the reverse direction increases, however, the reverse-direction voltage decreases due to the effects of the inductances $L_S$ and $L_M$. When the current flowing through the diode $D_S$ in the reverse-direction decreases, on the other hand, the reverse-direction voltage increases because of the effects of the inductances $L_S$ and $L_M$. In this way, a resonance phenomenon occurs due to a combination of the inductances $L_S$ and $L_L$ and the capacitor. The resonance phenomenon becomes not only a source of electromagnetic-noise generation, but also becomes a cause of circuit malfunction. In FIG. 13, the resonance phenomenon is shown by a dotted line.

The embodiment implementing a circuit in accordance with the present invention shown in FIG. 12 is used for suppressing the resonance phenomenon described above. The diode $D_S$ shown in the figure has the structure shown in FIGS. 10(a) and 10(b) and is driven by a voltage $V_{DS}$ applied thereto in the reverse direction, which voltage is higher than the punch-through voltage $V_P$ described above. At a point of time the reverse-direction voltage $V_{DS}$ reaches the magnitude of the punch-through voltage $V_P$, a punch-through current flows as an reverse recovery current, suppressing an abrupt decrease in reverse recovery current. For this reason, an abrupt increase in voltage $V_{DS}$ in the negative direction is not observed between the terminals of the diode $D_S$. As a result, no resonance phenomenon occurs due to the effects of inductances $L_S$ and $L_L$, allowing a reverse recovery characterized with no noise to be realized.

In addition, the present embodiment takes advantage of the punch-through current, as is obvious from the explanation of the present embodiment. It is thus not necessary to increase the thickness of a layer with a low impurity concentration in order to provide a carrier accumulating region for the flow of the reverse recovery current. As a result, the amount of loss which is incurred when a current is flowing in the forward direction does not increase.

A description of a snubber diode $D_S$ as an example has been given. However, it is obvious that the present invention can also be applied to a flywheel diode $D_F$ to obtain the same effects as the snubber diode $D_S$. In this case, the present invention has an effect of suppressing the resonance phenomenon caused by a combination of the inductance $L_L$ and the flywheel diode $D_F$, which phenomenon would otherwise occur during a transition of the switching device IGBT to an on state.

Figure 14:
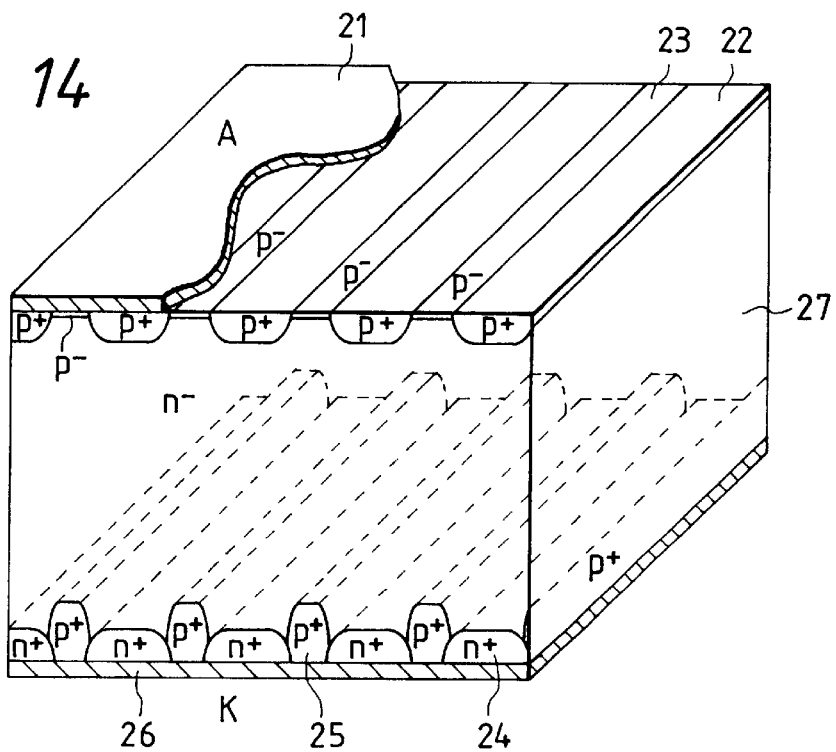
FIG. 14 is a schematic perspective view of an embodiment implementing a diode in accordance with the present invention.

Another embodiment provided by the present invention is shown in FIG. 14. The diode shown in this figure has a structure comprising a plurality of junction structures of FIGS. 10(a) and 10(b) combined with each other. The present diode is characterized in that the p$^+$ conductivity type semiconductor layer 25 on the side of the cathode electrode 26 is created more deeply in the n$^-$ conductivity type semiconductor layer than is the n$^+$ conductivity type semiconductor layer 24. As a result, the magnitude of the reverse-direction current for reverse-direction voltages higher than the punch-through voltage $V_P$, at which depletion layer reaches the p$^+$ conductivity type semiconductor layer 25, is greater than that of a structure shown in FIG. 15 to be described later.

In the case of the present embodiment, a p$^+$ conductivity type semiconductor layer 22 with an impurity concentration higher than that of the n$^-$ conductivity type semiconductor layer 27 and a p$^-$ conductivity type semiconductor layer 23 (a 5th semiconductor layer) with an impurity concentration lower than that of the p$^+$ conductivity type semiconductor layer 22 are provided alternately on the anode side to form alternating stripes. The anode electrode 21 is in ohmic contact with the p$^+$ conductivity type semiconductor layer 22, creating a Schottky barrier with the p$^-$ conductivity type semiconductor layer 23. In a steady on state, the carrier concentration is reduced in a portion of the device facing the Schottky barrier. Since the amount of reverse recovery electric charge at recovery time is reduced thereby, the switching operation of the diode is carried out at a higher speed. Further, in a current blocking state, a depletion layer widening from a pn junction between the n$^-$ conductivity type semiconductor layer 27 and the p$^+$ conductivity type semiconductor layer 22 pinches at the n$^-$ conductivity type semiconductor layer 27 right below the p$^-$ conductivity type semiconductor layer 23. Since the intensity of an electric field in the Schottky barrier is reduced thereby, the magnitude of the leakage current is decreased. On the other hand, an n$^+$ conductivity type semiconductor layer 24 with an impurity concentration higher than that of the n$^-$ conductivity type semiconductor layer 27 and a p$^+$ conductivity type semiconductor layer 25 with an impurity concentration higher than that of the n$^-$ conductivity type semiconductor layer 27 are provided alternately on the cathode side to form alternating stripes parallel to the stripes created on the anode side. In addition, since the p$^+$ conductivity type semiconductor layer 25 is located immediately beneath the p$^-$ conductivity type semiconductor layer 23, the distance from one of the semiconductor layers to the other can be minimized. For this reason, the forward-direction voltage in a steady on state becomes lower.

Figure 15:
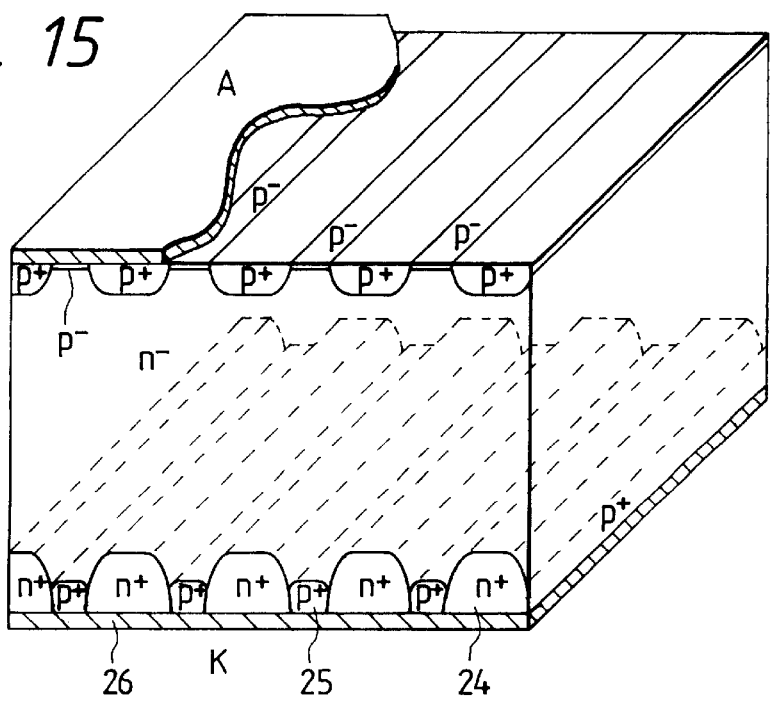
FIG. 15 is a schematic perspective view of another different embodiment implementing a diode in accordance with the present invention.

FIG. 15 shows a structure of a diode wherein the n$^+$ conductivity type semiconductor layer 24 created on the side of the cathode 26 is deeper than the p$^+$ conductivity type semiconductor layer 25 created on the same side. In general, it is more difficult to dope impurities at a high concentration to a p$^+$ conductivity type semiconductor than to an n$^+$ conductivity type semiconductor layer and it is thus easier to manufacture a structure wherein the p$^+$ conductivity type semiconductor layer 25 created on the side of the cathode 26 is shallower than the n$^+$ conductivity type semiconductor layer 24 created on the same side. Even if the diode with a structure shown in FIG. 15 is employed, a soft inverse recovery characteristic can be obtained by adopting the driving technique for the circuit shown in FIG. 12.

Figure 16:
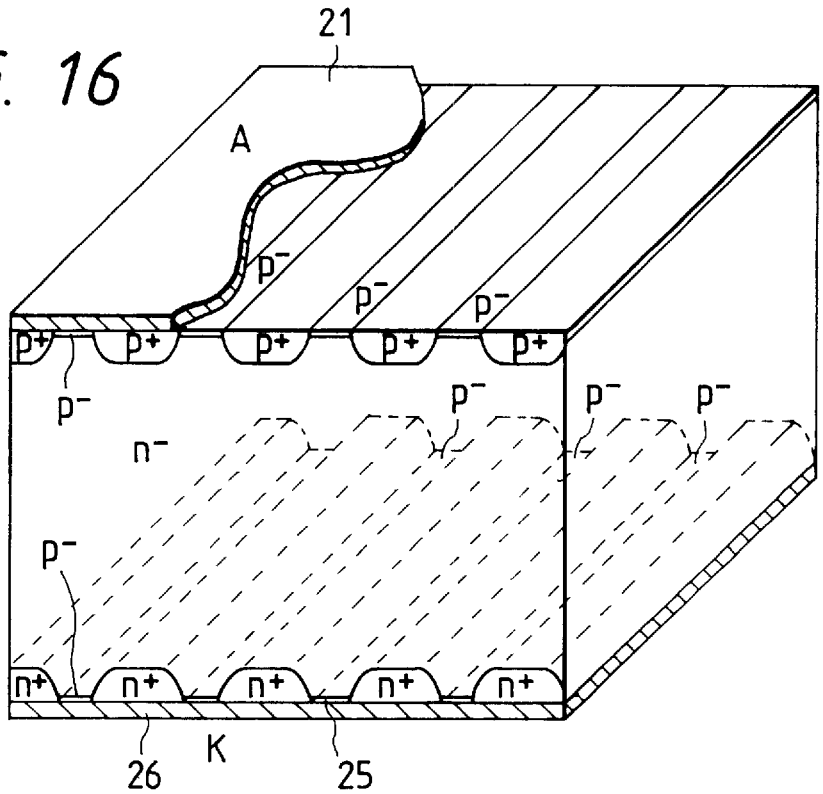
FIG. 16 is a schematic perspective view of a still other different embodiment implementing a diode in accordance with the present invention.

FIG. 16 shows the structure of another embodiment implementing a diode in accordance with the present invention. In the case of the diodes shown in FIGS. 14 and 15, a manufacturing process is required for creating the p$^+$ conductivity type semiconductor layer 25 on the side of the cathode 26. On the contrary, the diode with the structure shown in FIG. 16 has a characterizing feature in that a manufacturing process for creating the p$^+$ conductivity type semiconductor layer 25 can be omitted. The characterizing feature will be explained in concrete terms as follows. The anode electrode 21 and the cathode electrode 26 of the diode are created from aluminum or a compound material comprising aluminum and silicon. After the electrodes have been created, heat treatment at 400 to 500° C. is carried out in order to improve characteristics of electrical contact with semiconductor regions. At that time, aluminum in the electrodes diffuses to the semiconductor regions, creating a layer including the aluminum on each of the surfaces of the semiconductor regions. In silicon, since aluminum is an impurity of the p conductivity type, a region to which the aluminum has diffused becomes a semiconductor region of the p conductivity type. For this reason, the p$^+$ conductivity type semiconductor layer 25 can be created without adding a process for specially creating a p$^+$ conductivity type semiconductor layer. The semiconductor region of the p conductivity type created by the diffusion of the aluminum within the electrode is normally about 200 nm. Much like the embodiments described previously, the present embodiment also exhibits a soft inverse recovery characteristic as well.

Figure 17:
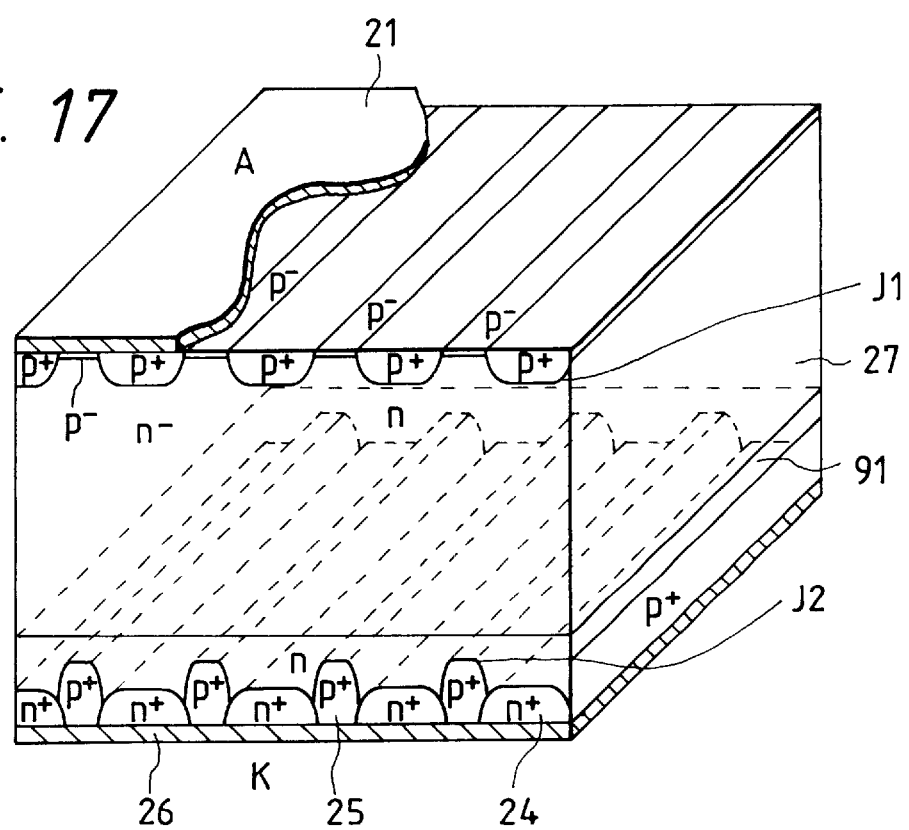
FIG. 17 is a schematic perspective view of a still further different embodiment implementing a diode in accordance with the present invention.

In addition, in the case of an embodiment wherein an n conductivity type semiconductor layer 91 is provided on the side of the cathode electrode 26 of an n$^-$ conductivity type semiconductor layer 27, as shown in FIG. 17, the same soft reverse recovery characteristic as provided by the embodiments described previously can be exhibited if the number of impurities between the junctions J1 and J2 satisfies the condition expressed by Exp. (17).

In the case of the embodiments shown in FIGS. 14 to 16, the punch-through voltage (that is, the voltage $V_P$ shown in FIG. 9) is adjusted mainly by varying the thickness of the n$^-$ conductivity type semiconductor layer 27, entailing variations in the forward direction voltage. In the case of the present embodiment, on the other hand, the punch-through voltage can be adjusted by varying the impurity concentration or the thickness of the n conductivity type semiconductor layer 91 which has a relatively higher impurity concentration than n$^-$ conductivity type semiconductor layer 27. In the case of the present embodiment variations in thickness of the n conductivity type semiconductor layer required for the adjustment of the punch-through $V_P$ are small in comparison with the n$^-$ conductivity type semiconductor layer for the same amount of $V_P$ adjustment, resulting in small variations in the forward direction voltage. As a result, a soft reverse recovery characteristic can be obtained while keeping variations in the forward direction voltage small.

Figure 18:
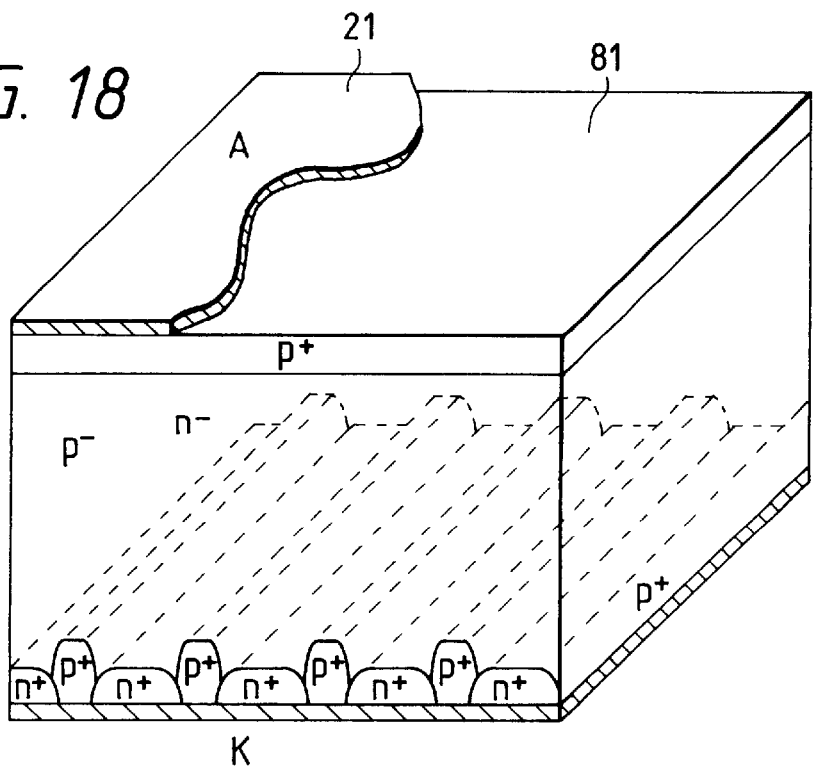
FIG. 18 is a schematic perspective view of a still further different embodiment implementing a diode in accordance with the present invention.

The diode implemented by the embodiment explained above has a structure comprising the p$^+$ conductivity type semiconductor layer 22 and the p⁻ conductivity type semiconductor layer 23 on the side of the anode electrode 21. In order to obtain the effects given by the method of driving the circuit shown in FIG. 12, none the less, the structure on the side of the anode electrode 21 does not necessarily have to be similar to that in FIG. 17. entire surface can be a p⁺ conductivity type semiconductor region 81, as is shown in FIG. 18. In addition, for example, a n type semiconductor region can be embedded in a p type semiconductor layer on the anode-electrode side. Furthermore, instead of the structure on the cathode-electrode side, wherein the entire surface of the n⁻ conductivity type semiconductor layer 27 is covered by the n⁺ conductivity type semiconductor layer 24 and the p⁺ conductivity type semiconductor layer 25, a portion of the n⁻ conductivity type semiconductor layer 27 can be brought into contact with the cathode electrode 26. Furthermore, the n⁺ conductivity type semiconductor layer 24 can be eliminated from the structure described above. An important condition required in obtaining a soft reverse recovery characteristic by means of the driving method implementing the present invention is for the diode to have a structure wherein a punch-through phenomenon occurs at a reverse-direction voltage below a voltage which results in an avalanche breakdown, causing a punch-through current to flow.

Figure 19A:
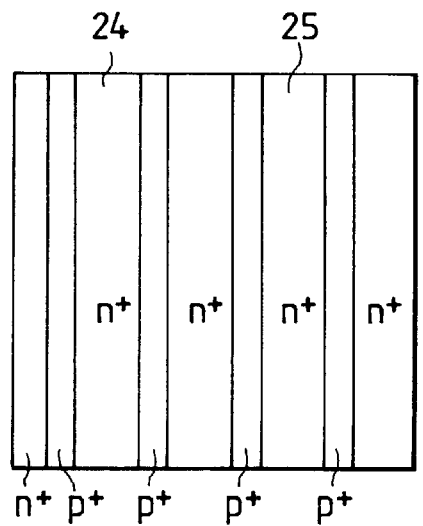
FIGS. 19(a) to 19(c) are diagrams which show plane patterns on the cathode-electrode side of a diode provided by the present invention.
Figure 19B:
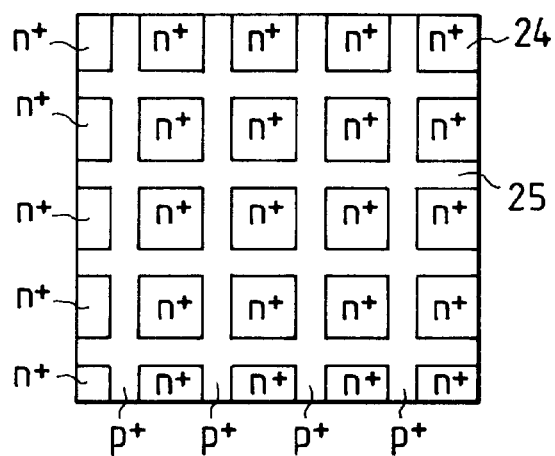
Figure 19C:
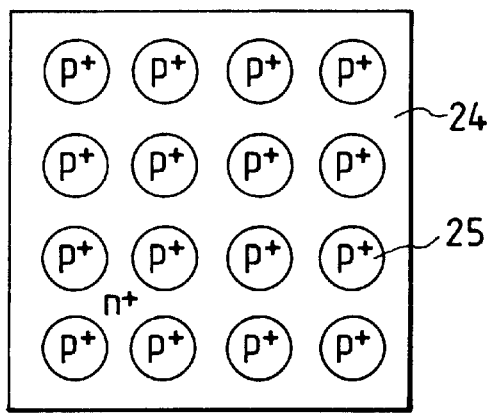

FIGS. 19(a) to 19(c) show a layout pattern of the p⁺ conductivity type semiconductor layer 25 and the n⁺ conductivity type semiconductor layer 24 on the side of the cathode electrode 26 of another embodiment implementing a diode in accordance with the present invention. FIG. 19(a) shows a structure wherein the p⁺ conductivity type semiconductor layer 25 and the n⁺ conductivity type semiconductor layer 24 are laid out to form stripes. FIG. 19(b) shows a structure wherein the p⁺ conductivity type semiconductor layer 25 encloses the n⁺ conductivity type semiconductor layer 24. FIG. 19(c) shows a structure wherein the n⁺ conductivity type semiconductor layer 24 encloses the p⁺ conductivity type semiconductor layer 25. It is obvious from the figures that the structure of an embodiment implementing a diode in accordance with the present invention is not dependent on the relative layout of the p⁺ conductivity type semiconductor layer 25 and the n⁺ conductivity type semiconductor layer 24. Any structure can be adopted as long as the p⁺ conductivity type semiconductor layer 25 and the n⁺ conductivity type semiconductor layer 24 are brought into contact with the n⁻ conductivity type semiconductor layer 27 and the cathode electrode. The rate of increase in current (that is, the current gradient) for reverse-direction voltages higher than the punch-through voltage $V_P$ can be changed in accordance with a ratio of the area of the p⁺ conductivity type semiconductor layer 25 to the area of the n⁺ conductivity type semiconductor layer 24. The area ratio can be set at a value according to the objective of the application.

Figure 20A:
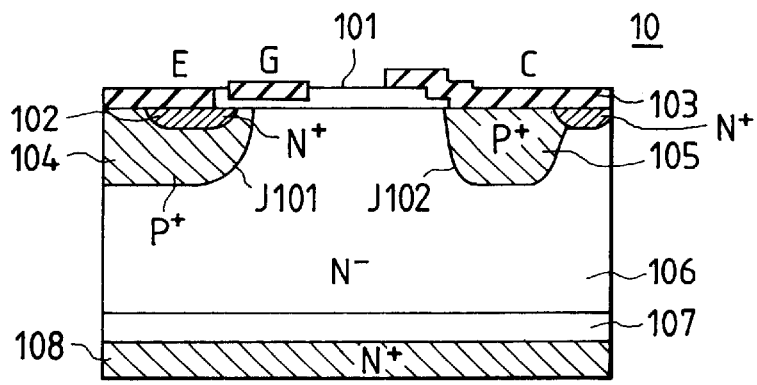
FIGS. 20(a) and 20(b) are diagrammatic views showing another insulated gate bipolar transistor and diode to which the present invention is applied, respectively.
Figure 20B:
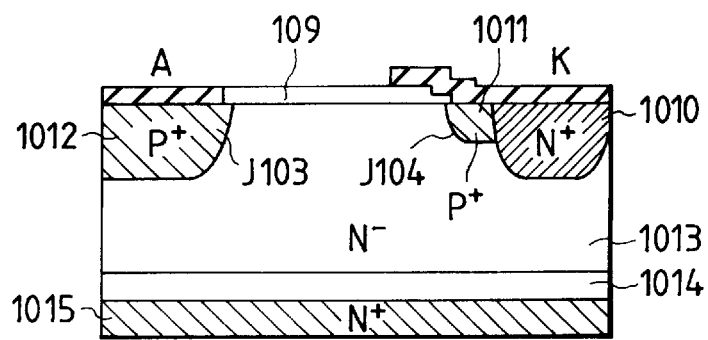

FIGS. 20(a) and 20(b) are views showing cross sections of embodiments implementing devices in accordance with the present invention. In each of the semiconductor devices described previously, the current flows in the top-down direction in the state shown in the figure. However, not only does the scope of the present invention cover devices having such a structure, but the present invention is also effective for a device in which the current flows in the horizontal direction as is shown in FIGS. 20(a) and 20(b). FIGS. 20(a) and 20(b) show an IGBT 10 and a diode, respectively.

The IGBT 10 shown in FIG. 20(a) operates as follows. In order to turn on the IGBT 10, a positive voltage relative to an emitter electrode E, which voltage has a magnitude greater than the threshold voltage, is applied to the gate electrode G. At that time, the surface of a p⁺ conductivity type semiconductor region 104 is inverted into the n type, connecting an n⁺ conductivity type semiconductor region 102 to an N⁻ conductivity type semiconductor region 106. As a result, electrons flow from the n⁺ conductivity type semiconductor region 102 to the N⁻ conductivity type semiconductor region 106. These electrons draw out holes from a P⁺ conductivity type semiconductor region 105. The holes then flow to the emitter electrode E through the p⁺ conductivity type semiconductor region 104, putting the IGBT 10 in a turned-on state. In order to turn the IGBT 10 off, a negative voltage is applied to the gate electrode G. The negative voltage stops the injection of electrons from the n⁺ type semiconductor region 102, causing the IGBT 10 to enter a turned-off state.

The device provided by the present invention is characterized in that the device includes an N⁺ conductivity type semiconductor region 103 and, in an off state, a depletion layer widening from a junction J101 reaches the p⁺ conductivity type semiconductor region 105 at a voltage lower than the avalanche breakdown voltage at a location in close proximity to the junction J101. That is to say, the number of impurities in the N⁻ conductivity type semiconductor region 106 between the p⁺ conductivity type semiconductor region 104 and the P⁻ conductivity type semiconductor region 105 satisfies Exp. 17. Since it is easy to understand that even an IGBT having such a structure can exhibit the current-voltage characteristic shown in FIG. 1, detailed explanation is omitted. In brief, the voltage at which the depletion layer reaches the junction J102 is the voltage value $V_1$ and, at the voltage value $V_2$, an avalanche-breakdown phenomenon occurs at a location in close proximity to the junction J101 due to holes injected from the P⁺ conductivity type semiconductor region 105.

FIG. 20(a) shows a structure in which the P⁺ conductivity type semiconductor region 105 is provided between the P⁺ conductivity type semiconductor region 104 and the N⁺ conductivity type semiconductor region 103. However, the scope of the present invention is not limited to such an arrangement. The N⁺ conductivity type semiconductor region 103 can be provided between the P⁺ conductivity type semiconductor region 104 and the P⁺ conductivity type semiconductor region 105. In addition, the structure shown in the figure can be designed so that the P⁺ conductivity type semiconductor region 105 has a deeper junction than the N⁺ conductivity type semiconductor region 103. That is to say, the structure shown in FIG. 20(a) can be designed so that the P⁻ conductivity type semiconductor region 105 is closer to an N⁺ conductivity type semiconductor region 108 than is the N⁺ conductivity type semiconductor region 103, which may be converse. In this case, the N⁻ conductivity type semiconductor region 106 through which the depletion layer widens is connected to the collector electrode C by a lower resistance. As a result, the rate of increase in current for blocking-direction voltages higher than the voltage value $V_1$ at which the depletion layer reaches the junction J102 is smaller than that of the structure shown in FIG. 20(a), resulting in the differential resistance being increased. This implies that, by adjusting the relation between the junction depth of the P⁺ conductivity type semiconductor region 105 and the junction depth of the N⁺ conductivity type semiconductor region 103, the differential resistance for blocking-direction voltages higher than the voltage value $V_1$ can be set at any arbitrary value, allowing a device with a differential resistance most suitable for the configuration of an application circuit to be provided.

In addition, the region 107 shown in FIGS. 20(a) and 20(b) is an electrical isolation region. If the N⁻ conductivity type semiconductor layer 106 is made sufficiently wider than the N⁻ conductivity type semiconductor region between the junctions J101 and J102, it is no longer necessary to provide this electrical isolation region. In this case, a region of the N⁻ conductivity type semiconductor layer 106 on the side of the N⁺ conductivity type semiconductor layer 108 functions as an electrical isolation region.

In a diode with a structure shown in FIG. 20(*b*), a current flows in a forward direction through an anode electrode A, a P⁺ conductivity type semiconductor region 1012, a N⁻ conductivity type semiconductor region 1013, a N⁺ conductivity type semiconductor region 1010 and a cathode electrode K. This diode provided by the present invention is characterized in that the diode includes a P⁺ conductivity type semiconductor layer 1011 and, in an off state established by a positive voltage relative to the anode electrode A applied to the cathode electrode K, a depletion layer widening from a junction J103 reaches the P⁺ conductivity type semiconductor region 1011 at a voltage lower than the avalanche breakdown voltage at a location in close proximity to the junction J101. Also, in the case of this diode, the voltage at which the depletion layer reaches the P⁺ conductivity type semiconductor layer 1011 is the voltage value $V_1$ shown in FIG. 1 and, at the voltage value $V_2$, an avalanche-breakdown phenomenon occurs at a location in close proximity to the junction J103 due to holes injected from the P⁺ conductivity type semiconductor region 1011 at a voltage higher than the voltage value $V_1$.

It should be noted that, as in the case of the diode having a structure shown in FIG. 20(*b*), the junction depth of the P⁺ conductivity type semiconductor region 1011 and the junction depth the N⁺ conductivity type semiconductor region 1010 are not prescribed by the relation shown in the figure. That is to say, the P⁺ conductivity type semiconductor region 1011 can be made deeper than the N⁺ conductivity type semiconductor region 1010. It is worth noting that, in this case, the effect on the blocking-direction current-voltage characteristic is the same as the case shown in FIG. 20(*a*), making it unnecessary to repeat the explanation here. The region 1014 is an electrical isolation layer similar to the electrical isolation layer shown in FIG. 20(*a*).

Figure 21:
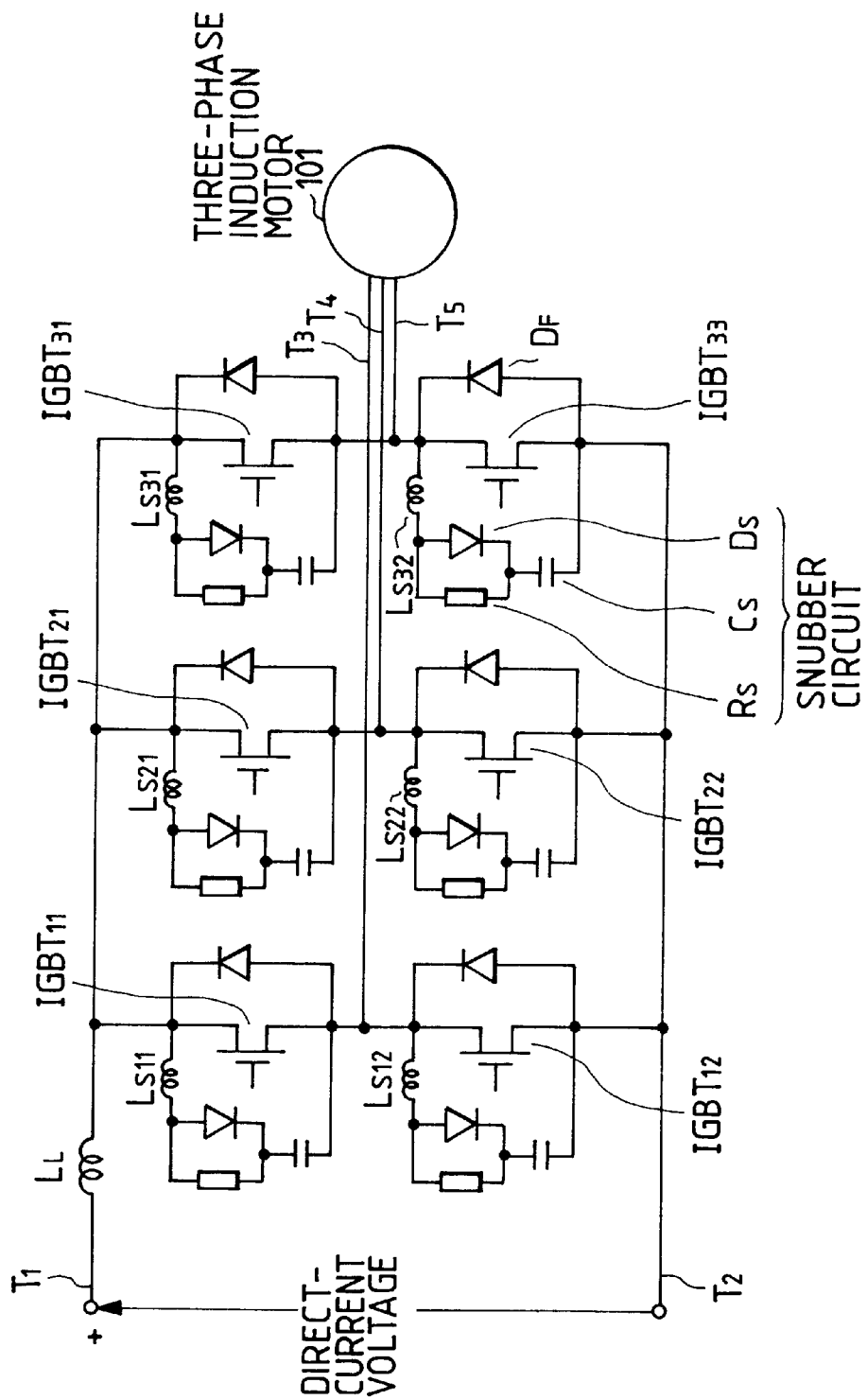
FIG. 21 is a circuit diagram which shows an embodiment implementing the circuit shown in FIG. 3(a) as an inverter circuit.

FIG. 21 shows an embodiment which implements the circuit shown in FIG. 3(*a*) as an inverter circuit of a three-phase induction motor. As shown in the figure, two IGBTs 11 and 12, each serving as a switching device, are connected to each other in series for each phase of the three-phase induction motor. In addition, a flywheel diode $D_F$ is connected in parallel to each of the switching devices. Furthermore, a so-called snubber circuit S is connected also in parallel to each of the switching devices in order to protect the switching device against an abrupt increase in voltage which occurs during switching. The snubber circuit comprises a capacitor $C_S$ connected in series to a parallel circuit composed of the diode $D_S$ and the resistor $R_S$. The junction points each existing between two switching devices associated with one of the three phases are connected to alternating-current terminals $T_3$, $T_4$ and $T_5$ which are connected to the three-phase induction motor. The anode terminals of the three switching devices on the upper-arm side are connected by a common line to a direct-current terminal $T_1$, which is connected to the high-potential side of a direct-current power supply. Likewise, the cathode terminals of the three switching devices on the lower-arm side are connected by a common line to a direct-current terminal $T_2$ which is connected to the low-potential side of the direct-current power supply. With the inverter circuit having such a configuration, a direct-current power is converted into an alternating-current power by switching operations of the switching devices, which alternating-current power is then used for driving the three-phase induction motor.

Since it is easy to understand the operation of the inverter circuit shown in FIG. 21 once the operation of the circuit shown in FIG. 3(*a*) is understood, the explanation of the inverter circuit's operation is omitted. It should be noted that, as a matter of course, the IGBT serving as a switching device and the flywheel diode $D_F$ and the snubber diode $D_S$ employed in the inverter circuit are devices which each exhibit the blocking-direction current-voltage characteristic shown in FIG. 1 and have the actual structures shown in the above-mentioned embodiment. Circuit constants are set so that, if necessary, the voltage applied to each of the devices in the cut-off state thereof exceeds the voltage value $V_1$. For this reason, in the case of the inverter circuit implemented by the present embodiment, the differential resistance at the voltage value $V_1$ allows the resonance phenomenon of the current and voltage to be suppressed, the possibility of the occurrence of a malfunction in the inverter circuit and the amount of electromagnetic noise to be substantially reduced and the generation of an excessively large voltage to be suppressed.

As described above, the power converting circuit implemented by the present embodiment has a configuration which includes a snubber circuit. It should be noted, however, that if the power converter employs a heat dissipating unit which prevents the switching device and the flywheel diode from being thermally damaged by heat dissipated thereby, even if all energy accumulated in the parasitic inductance $L_L$ of wires of the main circuit is expended in the switching device and the flywheel diode, the snubber circuit is not necessarily required. The most valuable merit that the embodiment shown in FIG. 21 offers is the fact that the amount of electromagnetic noise and the excessively large voltage can be substantially suppressed by merely substituting the semiconductor devices provided by the present invention for the semiconductor devices employed in the conventional power converting apparatus, without the need to change the circuit configuration thereof.

It should be noted that a power converting apparatus provided by the present invention can be effectively implemented not only by the circuit configuration of the present embodiment described above, but the same effect can also be obtained by using any circuit employing semiconductor devices each having such a structure that, at voltages higher than the voltage value $V_1$ applied to the semiconductor device in a blocking state, a current flows and, as the applied voltage further increases, exceeding the voltage value $V_2$, the current starts to increase abruptly. In addition, the structure of the diode employed in the power converting apparatus to which the present invention is applied is not limited to the one implemented by the embodiment explained so far. The diode can have any structure as long as a current flows at voltages higher than the voltage value $V_1$ applied to the diode in a blocking state, and, as the applied voltage further increases, exceeding the voltage value $V_2$, the current starts to increase abruptly at a rate higher than the rate of increase in current for blocking-direction voltages between the voltage values $V_1$ and $V_2$.

Moreover, in the semiconductor devices described above, the layout of the P conductivity type semiconductor region and the N conductivity type semiconductor region can be reversed. In such a scheme, the depletion layer mainly widens in the P⁻ conductivity type semiconductor region.

Figure 22:
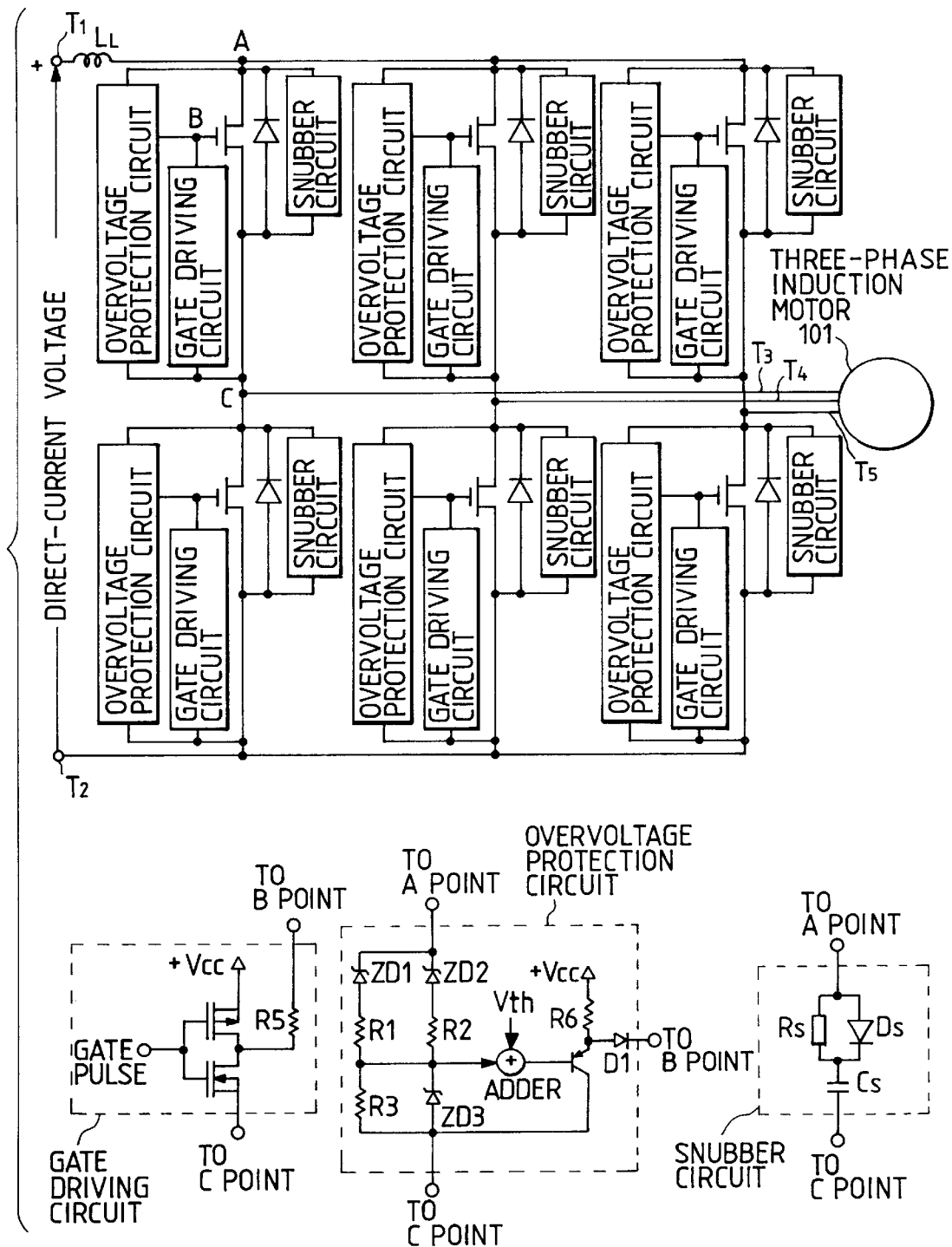
FIG. 22(a) is a circuit diagram which shows an embodiment implementing the circuit shown in FIG. 5 as an inverter circuit and FIGS. 22(b), 22(c) and 22(d) are circuit diagrams which show components of the circuit of FIG. 22(a)

FIG. 22(*a*) shows an embodiment for implementing the circuit shown in FIG. 5 as an inverter circuit of a three-phase induction motor. As shown in the figure, two switching devices are connected to each other in series for each phase of the three-phase induction motor. In addition, a flywheel diode $D_F$ is connected in parallel to each of the switching devices. Furthermore, the so-called snubber circuit S is connected also in parallel to each of the switching devices in order to protect the switching device against an abrupt increase in voltage which occurs during switching. A gate driving circuit, as shown in detail in FIG. 22(b), and an overvoltage protection circuit, as shown in detail in FIG. 22(c), are connected to the Rate electrode of each of the switching devices.

The junction points each existing between two switching devices associated with one of the three phases are connected to alternating-current terminals $T_3$, $T_4$ and $T_5$ which are connected to the three-phase induction motor. The anode terminals of the three switching devices on the upper-arm side are connected by a common line to a direct-current terminal $T_1$ which is connected to the high-potential side of a direct-current power supply. Likewise, the cathode terminals of the three switching devices on the lower-arm side are connected by a common line -to a direct-current terminal $T_2$ which is connected to the low-potential side of the direct-current power supply. With the inverter circuit having such a configuration, a direct-current power is converted into an alternating-current power by switching operations of the switching devices, which alternating current power is then used for driving the three-phase induction motor.

Since it is easy to understand the operation of the inverter circuit shown in FIG. 22 once the operation of the circuit shown in FIG. 5 is understood, the explanation of the inverter circuit's operation is omitted. It should be noted that, as a matter of course, the actual configurations of the overvoltage protection circuit and the gate driving circuit are the same as those shown in FIG. 5. The overvoltage protection circuit controls the gate voltage in accordance with the magnitude of the voltage between the main terminals of the switching device. The overvoltage protection circuit controls the switching device in such a way that, the current flowing through the switching device increases gradually at voltages higher than the voltage value $V_1$ applied to the switching device in a blocking state, and, as the applied voltage further increases, exceeding the voltage value $V_2$, the current starts to increase abruptly at a rate higher than the rate of increase in current for blocking-direction voltages between the voltage values $V_1$ and $V_2$. For this reason, in the case of the inverter circuit implemented by the present embodiment, the differential resistance at the voltage value $V_1$ allows the resonance phenomenon of the current and voltage to be suppressed, the possibility of the occurrence of a malfunction in the inverter circuit and the amount of electromagnetic noise to be substantially reduced and the generation of an excessively large voltage to be suppressed.

As described above, the power converting circuit implemented by the present embodiment has a configuration which includes a snubber circuit. It should be noted, however, that if the power converter employs a heat dissipating unit which prevents the switching device and the flywheel diode from being thermally damaged by heat dissipated thereby, even if all energy accumulated in the parasitic inductance $L_L$ of wires of the main circuit is expended in the switching device and the flywheel diode, the snubber circuit is not necessarily required. The most valuable merit that the embodiment shown in FIG. 22 offers is the fact that the amount of electromagnetic noise and the excessively large voltage can be substantially suppressed by merely adding overvoltage protection circuits provided by the present invention. In addition, the embodiment shown in FIG. 22 is characterized in that the voltage value $V_1$ at which the current starts to increase gradually, the voltage value $V_2$ at which the current increases abruptly, as well as the current-voltage characteristic for blocking-direction voltages between the voltage values $V_1$ and $V_2$ and for blocking-direction voltages higher than the voltage value $V_2$ can be changed with a high degree of freedom by merely changing the breakdown voltages of the avalanche diodes ZD1, ZD2 and ZD3 and the resistances of the resistors R1, R2 and R3 employed in the overvoltage protection circuit.

Figure 23A:
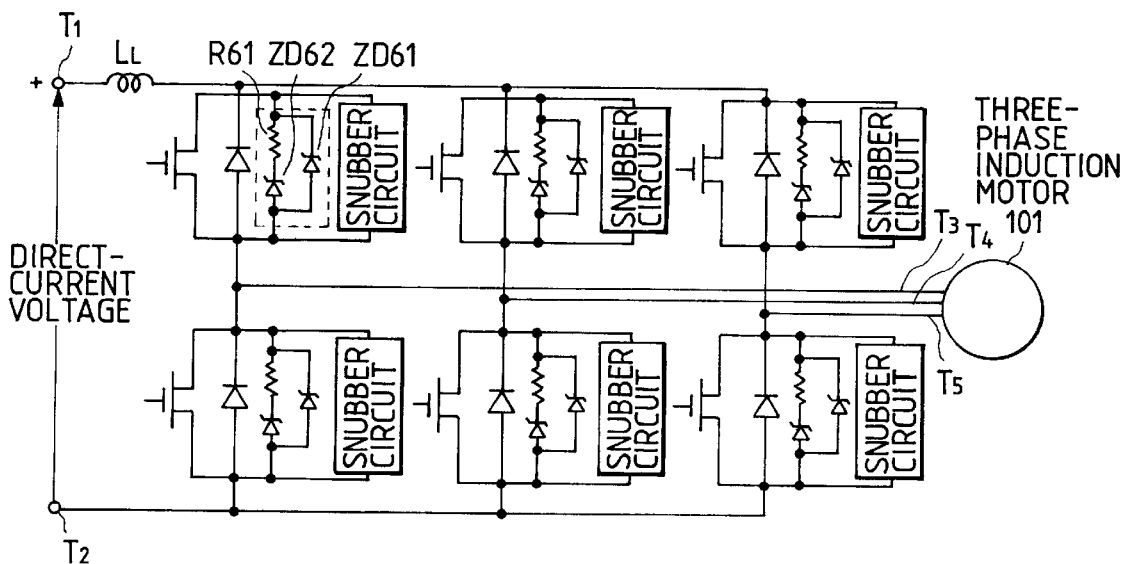
FIGS. 23(a) to 23(c) are circuit diagrams which show an embodiment applying the circuit shown in FIG. 6 to an inverter circuit.
Figure 23B:
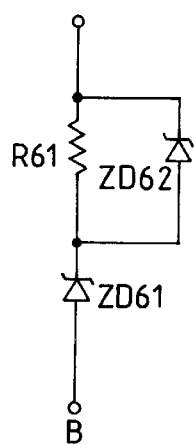
Figure 23C:
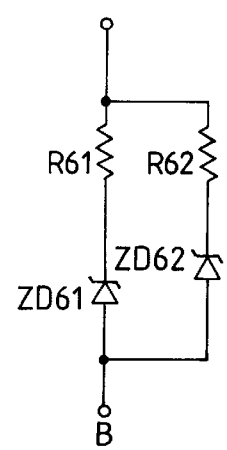

FIGS. 23(a) to 23(c) show an embodiment for implementing the circuit shown in FIG. 6(a) as an inverter circuit. Since the inverter circuit is the same as the circuits shown in FIGS. 21 and 22(a), the explanation of the inverter circuit shown in FIGS. 23(a) to 23(c) is omitted. The power converting apparatus implemented by the present embodiment has a configuration wherein the circuit comprising the avalanche diodes ZD61 and ZD62 and the resistor R61 shown in FIG. 6(a) is connected in parallel to a switching device.

It is easy to understand the operation of the inverter circuit shown in FIGS. 23(a) to 23(c) once the operation of the circuit shown in FIG. 6(a) is understood. As has been described by referring to FIG. 6(a), the circuit comprising the avalanche diodes ZD61 and ZD62 and the resistor R61 exhibits a current-voltage characteristic, according to which, the current flowing through the circuit starts to increase gradually as the voltage applied to the circuit in a blocking state of the switching devices becomes equal to the voltage value $V_1$ and, as the applied voltage further increases, exceeding the voltage value $V_2$, the current increases abruptly. For this reason, in the case of the inverter circuit implemented by the present embodiment, the differential resistance developed at blocking-direction voltages higher than the voltage value $V_1$ allows the resonance phenomenon of the current and voltage to be suppressed, the possibility of the occurrence of a malfunction in the inverter circuit and the amount of electromagnetic noise to be substantially reduced and the generation of an excessively large voltage to be suppressed.

As described above, the power converting circuit implemented by the present embodiment has a configuration which includes a snubber circuit. It should be noted, however, that if the power converter employs a heat dissipating unit which prevents the switching device and the flywheel diode from being thermally damaged by heat dissipated thereby, even if all energy accumulated in the parasitic inductance $L_L$ of wires of the main circuit is expended in the switching device and the flywheel diode, the snubber circuit is not necessarily required. The most valuable merit that the embodiment shown in FIGS. 23(a) to 23(c) offers is the fact that the amount of electromagnetic noise and an excessively large voltage can be substantially suppressed by merely adding extremely simple circuits, each comprising avalanche diodes and a resistor, to the conventional power converting apparatus. In addition, the embodiment shown in FIGS. 23(a) to 23(c) is also characterized in that the effect of suppressing the electromagnetic noise and an extremely large voltage can be varied with a high degree of freedom by merely changing the breakdown voltages of the avalanche diodes ZD61 and ZD62 and the resistance of the resistors R61. It should be noted that the circuit comprising avalanche diodes and resistors can also have a configuration shown in FIGS. 23(b) or 23(c).

In the embodiments of the present invention described so far, the differential resistance for blocking-direction voltages higher than the first voltage value $V_1$ does not have to have a fixed value. That is to say, the differential resistance may vary with the blocking-direction voltage. In this case, it is even nicer to have a characteristic, according to which, the differential resistance decreases gradually with an increase in blocking-direction voltage. Note that it is desirable to have a differential resistance satisfying Exp. 6 for all blocking-direction voltages higher than the voltage value $V_1$. None the less, it is not necessary to adhere to this condition. That is to say, a differential resistance satisfying Exp. 6 for at least an arbitrary blocking-direction voltage is also acceptable.

Furthermore, in the present invention, the blocking-direction voltage $V_1$ at which a current starts to flow gradually can be set at a value higher by 5% to 20% than the voltage applied to the apparatus in a steady state, normally, the voltage of the power supply. In addition, it is desirable to set the voltage $V_2$ at which the current increases abruptly at a value higher by 50% to 100% than the voltage applied to the apparatus in the steady state. The reason for setting the voltage $V_1$ at such a value is that, if the voltage $V_1$ is set at a value lower than the voltage applied to the apparatus in a steady state, a blocking-direction current will flow in a steady state other than a switching operation of the apparatus, causing a lot of loss to be incurred. As for the reason for setting the voltage $V_2$ at such a value, setting the voltage $V_2$ at too large a value will give rise to a problem that the apparatus itself and other equipment connected in parallel to the apparatus inevitably entail a breakdown voltage even higher than the voltage value $V_2$.

It is needless to say that the technical term avalanche diode used in the description of the invention also implies a device such as a Zener diode or a varistor wherein a current starts to flow abruptly at a prescribed voltage. What is important is that the device has a structure wherein, up to a certain voltage, only a leakage current flows but, as the voltage reaches a certain level, the current abruptly increases.

Furthermore, the scope of the present invention is not limited to inverter circuits. The present invention can also be applied to a variety of power controlling apparatuses and power converting apparatuses such as converter circuits and chopper circuits as well as a variety of switching power supplies.

As described above, according to the present invention, energy accumulated in elements of a circuit, such as inductances, can be expended in a differential resistance of the circuit or a semiconductor device, preventing electromagnetic noise and an excessively large voltage from being generated during a transition of the circuit or the semiconductor device to a cut-off state. As a result, a malfunction of the circuit due to electromagnetic noise can be prevented from occurring and components of the circuit can be prevented from being damaged by an excessively large voltage.

What is claimed is:

1. A semiconductor device comprising:
   a first semiconductor layer of a first conductivity type;
   a semiconductor layer of a second conductivity type provided on said first semiconductor layer;
   a third semiconductor layer of the first conductivity type adjacent to said second semiconductor layer;
   a fourth semiconductor layer of the second conductivity adjacent to said first semiconductor layer;
   a fifth semiconductor layer of the first conductivity type adjacent to said first and fourth semiconductor layers;
   a first main electrode in ohmic contact with said second and third semiconductor layers;
   a second main electrode in ohmic contact with said fourth and fifth semiconductor layers; and
   an insulated-gate electrode extending over said first, second and third semiconductor layers,
   wherein a junction between said first and fourth semiconductor layers exists at a location closer to a junction between said first and second semiconductor layers than a junction between said first and fifth semiconductor layers does.

2. A semiconductor device according to claim 1,
   wherein the first conductivity type is one of a P and N-type conductivity, and the second conductivity type is the other one of the P and N-type conductivity, and
   wherein said first semiconductor layer is a relatively low impurity concentration layer and said second, third, fourth and fifth semiconductor layers are relatively high impurity concentration layers.

3. A semiconductor device comprising:
   a first semiconductor layer of a first conductivity type;
   second semiconductor layer of a second conductivity type provided on said first semiconductor layer;
   a third semiconductor layer of the first conductivity type adjacent to said second semiconductor layer;
   a fourth semiconductor layer of the second conductivity type adjacent to said first semiconductor layer;
   a fifth semiconductor layer of the first conductivity type adjacent to said first and fourth semiconductor layers;
   a first main electrode in ohmic contact with said second and third semiconductor layers;
   a second main electrode in ohmic contact with said fourth and fifth semiconductor layers; and
   an insulated-gate electrode extending over said first, second and third semiconductor layers,
   wherein the number of impurities of the first conductivity type in a unit area on said first semiconductor layer sandwiched by a junction between said first and second semiconductor layers and a junction between said first and fourth semiconductor layers is equal to or smaller than $(\epsilon_m) \cdot (\epsilon_s)/q$, where symbol $\epsilon_m$ denotes the avalanche-breakdown electric field of a material used for making said first semiconductor layer, symbol $\epsilon_s$ is the dielectric constant of said material and q is the amount of electric charge of an electron.

4. A semiconductor device according to claim 3,
   wherein the first conductivity type is one of a P and N-type conductivity and the second conductivity type is the other one of the P and N-type conductivity.

5. A semiconductor device comprising:
   a first semiconductor layer of a first conductivity type;
   a second semiconductor layer of a second conductivity type and a third semiconductor layer of the second conductivity type provided on said first semiconductor layer;
   a fourth semiconductor layer of the first conductivity type and a fifth semiconductor layer of the first conductivity type adjacent to said second semiconductor layer;
   a sixth semiconductor layer of the first conductivity type adjacent to said third semiconductor layer;
   a seventh semiconductor layer of the second conductivity type adjacent to said first semiconductor layer;
   an eighth semiconductor layer of the first conductivity type adjacent to said first and seventh semiconductor layers;
   a first main electrode in ohmic contact with said second and fourth semiconductor layers;

a second main electrode in ohmic contact with said seventh and eighth semiconductor layers;

a first insulated-gate electrode extending over said second, fourth and fifth semiconductor layers; and a second insulated-gate electrode extending over said first, second and third semiconductor layers;

wherein said fifth and sixth semiconductor layers are electrically connected to each other, and wherein a junction between said first and seventh semiconductor layers exists at a location closer to a junction between said first and second semiconductor layers than a junction between said first and eighth semiconductor layers does.

6. A semiconductor device according to claim 5, wherein the first conductivity type is one of a P and N-type conductivity, and the second conductivity type is the other one of the P and N-type conductivity, and wherein said first semiconductor layer is a relatively low impurity concentration layer and said second through eighth semiconductor layers are relatively high impurity concentration layers.

7. A semiconductor device comprising:

a first semiconductor layer of a first conductivity type;

a second semiconductor layer of a second conductivity type and a 3rd semiconductor layer of the second conductivity type provided on said first semiconductor layer;

a fourth semiconductor layer of the first conductivity type and a fifth semiconductor layer of the first conductivity type adjacent to said second semiconductor layer;

a sixth semiconductor layer of the first conductivity type adjacent to said third semiconductor layer;

a seventh semiconductor layer of the second conductivity type adjacent to said first semiconductor layer;

an eighth semiconductor layer of the first conductivity type adjacent to said first and seventh semiconductor layers;

a first main electrode in ohmic contact with said second and fourth semiconductor layers;

a second main electrode in ohmic contact with said seventh and eighth semiconductor layers;

a first insulated-gate electrode extending over said second, fourth and fifth semiconductor layers; and a second insulated-gate electrode extending over said first, second and third semiconductor layers, wherein the number of impurities of the first conductivity type in a unit area on said first semiconductor layer sandwiched by a junction between said first and second semiconductor layers and a junction between said first and seventh semiconductor layers is equal to or smaller than $(\epsilon_m)\cdot(\epsilon_s)/q$, where symbol $\epsilon_m$ denotes the avalanche-breakdown electric field of a material used for making said first semiconductor layer, symbol $\epsilon_s$ is the dielectric constant of said material and q is the amount of electric charge of an electron.

8. A semiconductor device according to claim 7, wherein the first conductivity type is one of a P and N-type conductivity and the second conductivity type is the other one of the P and N-type conductivity.

9. A diode comprising:

a first semiconductor layer of a first conductivity type;

a second semiconductor layer of a second conductivity type provided on said first semiconductor layer;

a third semiconductor layer of the second conductivity type adjacent to said first semiconductor layer;

a fourth semiconductor layer of the first conductivity type adjacent to said first and third semiconductor layers;

a first main electrode in ohmic contact with said second semiconductor layer; and a second main electrode in ohmic contact with said third and fourth semiconductor layers, wherein a junction between said first and third semiconductor layers exists at a location closer to a junction between said first and second semiconductor layers than a junction between said first and fourth semiconductor layers does.

10. A diode according to claim 9, wherein the first conductivity type is one of a P and N-type conductivity, and the second conductivity type is the other one of the P and N-type conductivity, and wherein said first semiconductor layer is a relatively low impurity concentration layer and said second, third and fourth semiconductor layers are relatively high impurity concentration layers.

11. A diode comprising:

a first semiconductor layer of a first conductivity type;

a second semiconductor layer of a second conductivity type provided on said first semiconductor layer;

a third semiconductor layer of the second conductivity type adjacent to said first semiconductor layer;

a fourth semiconductor layer of the first conductivity type adjacent to said first and third semiconductor layers;

a first main electrode in ohmic contact with said second semiconductor layer; and a second main electrode in ohmic contact with said third and fourth semiconductor layers, wherein the number of impurities of the first conductivity type in a unit area on said first semiconductor layer sandwiched by a junction between said first and second semiconductor layers and a junction between said first and third semiconductor layers is equal to or smaller than $(\epsilon_m)\cdot(\epsilon_s)/q$, where symbol $\epsilon_m$ denotes the avalanche-breakdown electric field of a material used for making said first semiconductor layer, symbol $\epsilon_s$ is the dielectric constant of said material and q is the amount of electric charge of an electron.

12. A diode according to claim 11, wherein the first conductivity type is one of a P and N-type conductivity and the second conductivity type is the other one of the P and N-type conductivity.

* * * * *